United States Patent
Hirama

(10) Patent No.: US 9,401,695 B2
(45) Date of Patent: Jul. 26, 2016

(54) IMMITTANCE CONVERSION CIRCUIT AND FILTER

(71) Applicant: MARCDEVICES CO., LTD., Hiratsuka-shi, Kanagawa (JP)

(72) Inventor: Koichi Hirama, Hiratsuka (JP)

(73) Assignee: MARCDEVICES CO., LTD., Kanagawa (JP)

( * ) Notice: Subject to any disclaimer, the term of this patent is extended or adjusted under 35 U.S.C. 154(b) by 0 days.

(21) Appl. No.: 14/766,582

(22) PCT Filed: Jun. 25, 2013

(86) PCT No.: PCT/JP2013/067316
§ 371 (c)(1),
(2) Date: Aug. 7, 2015

(87) PCT Pub. No.: WO2014/122808
PCT Pub. Date: Aug. 14, 2014

(65) Prior Publication Data
US 2015/0381145 A1 Dec. 31, 2015

(30) Foreign Application Priority Data
Feb. 7, 2013 (WO) .................. PCT/JP2013/052896

(51) Int. Cl.
*H03H 11/40* (2006.01)
*H03H 11/46* (2006.01)

(52) U.S. Cl.
CPC ............... *H03H 11/40* (2013.01); *H03H 11/46* (2013.01)

(58) Field of Classification Search
CPC ... H03H 11/40; H03H 11/46; H03H 11/0416; H03H 11/08; H03H 11/10
USPC ................................................. 333/213–217
See application file for complete search history.

(56) References Cited

U.S. PATENT DOCUMENTS

| | | | |
|---|---|---|---|
| 6,008,691 A * | 12/1999 | Morita | H03H 11/46 327/552 |
| 6,121,940 A | 9/2000 | Skahill et al. | |
| 7,235,981 B2 * | 6/2007 | Hirabayashi | H03H 11/40 324/607 |

FOREIGN PATENT DOCUMENTS

| | | |
|---|---|---|
| JP | 06141354 A | 5/1994 |
| JP | 2003133907 A | 5/2003 |
| JP | 2005328272 A | 11/2005 |
| WO | 2011099438 A1 | 8/2011 |

OTHER PUBLICATIONS

International Search Report corresponding to Application No. PCT/JP2013/067316; Date of Mailing: Oct. 1, 2013, with English translation.

* cited by examiner

*Primary Examiner* — Dean Takaoka
*Assistant Examiner* — Alan Wong
(74) *Attorney, Agent, or Firm* — Cantor Colburn LLP

(57) ABSTRACT

An immittance conversion circuit includes a first terminal and a second terminal, and includes: a conversion target circuit configured to amplify or attenuate a signal with desired frequency and gain characteristics, and output the resultant signal; a difference signal detection circuit configured to supply the input terminal of the conversion target circuit with a signal of a difference between signals generated at the first and second terminals; an immittance conversion drive circuit configured to perform differential output processing to generate a voltage of a difference between a correction voltage and the signal outputted from the conversion target circuit, and output feedback signals to an immittance conversion generation circuit; and the immittance conversion generation circuit having an immittance conversion generation action to generate, at each of the first and second terminals, a signal of currents or voltages of the corresponding inputted feedback signal and the signal inputted to the first or second terminal. A signal of a difference between the signals generated at the first and second terminals is inputted to the immittance conversion drive circuit as the correction voltage.

10 Claims, 17 Drawing Sheets

FIG. 5
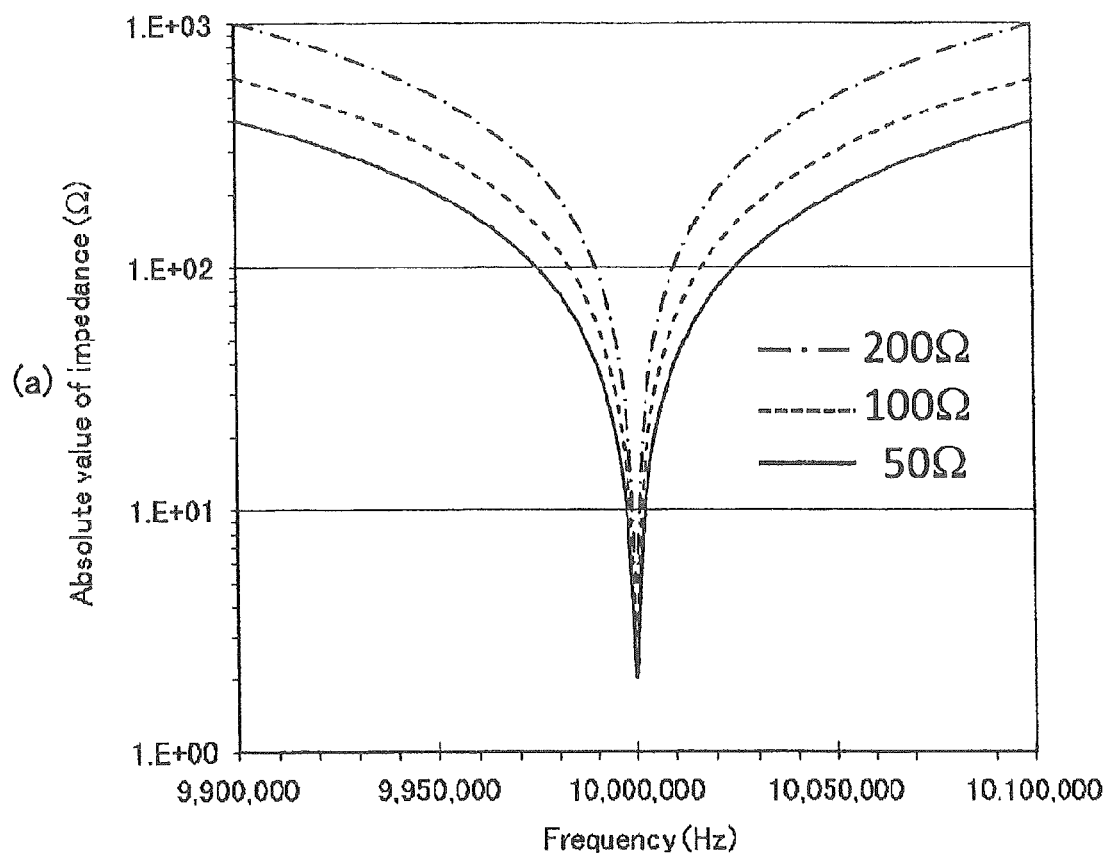
(a)
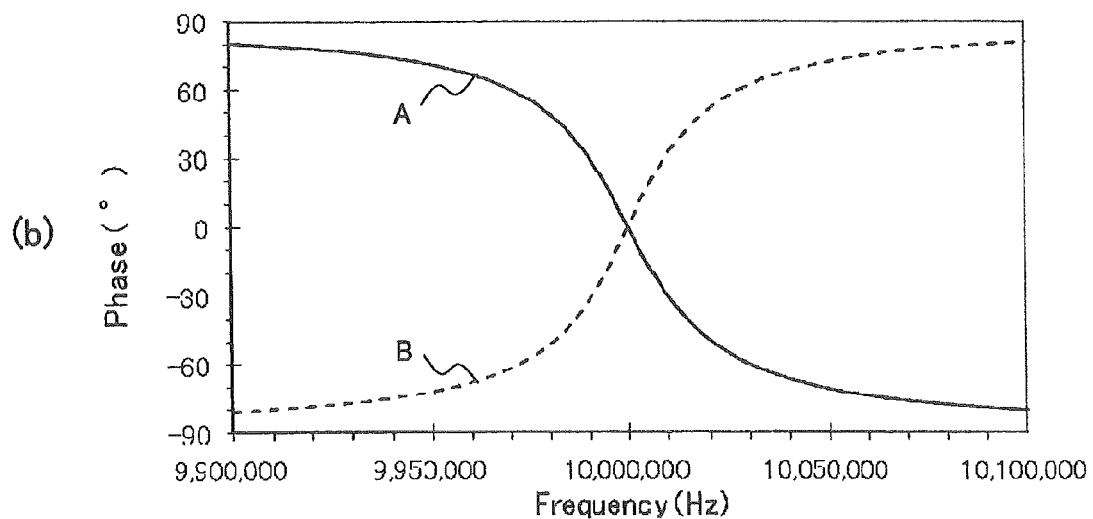
(b)

FIG. 17

TABLE 1

| SIGN | NAME | SYMBOL | VALUE | UNIT |
|---|---|---|---|---|
| 1 | TOTAL GAIN | $\mu ta =$ | 10000 | |
| 5 | FIRST IMMITTANCE LEVEL SETTING IMPEDANCE | $RIL1 =$ | 200, 100, 50 | $\Omega$ |
| | SECOND IMMITTANCE LEVEL SETTING IMPEDANCE | $RIL2 =$ | 200, 100, 50 | $\Omega$ |
| 9A | OUTPUT IMPEDANCE | $Zoutr =$ | 78.5 | $\Omega$ |
| | VOLTAGE GAIN | $\mu b =$ | 1 | |
| 9B | SERIES RESISTANCE | $R =$ | 0 | $\Omega$ |
| | SERIES INDUCTANCE | $L =$ | 25 | mH |
| | SERIES CAPACITANCE | $C =$ | 10.132211 | fF |
| | VOLTAGE GAIN | $\mu r =$ | 1 | |
| 9C | INPUT IMPEDANCE | $Zinr =$ | 78.5 | $\Omega$ |
| | VOLTAGE GAIN | $\mu c =$ | 1 | |

FIG. 18

TABLE 2

| | DOMINANT TRANSMISSION CHARACTERISTICS OF CONVERSION TARGET CIRCUIT 9 | EMBODIMENT 1<br>TWO-TERMINAL IMPEDANCE = z0<br>RIL IS RESISTIVE ELEMENT | EMBODIMENT 4<br>TWO-TERMINAL IMPEDANCE = z0<br>RIL IS RESISTIVE ELEMENT |
|---|---|---|---|
| A | R | $\propto \pm R$ | $\propto \pm 1/R$ |
| B | $1/j\omega C$ | $\propto \pm 1/j\omega C$ | $\propto \pm j\omega C$ |
| C | $j\omega L$ | $\propto \pm j\omega L$ | $\propto \pm 1/j\omega L$ |
| D | SERIES RESONANCE CIRCUIT | $\propto \pm$(SERIES RESONANCE IMPEDANCE) | $\propto \pm$(PARALLEL RESONANCE IMPEDANCE) |
| E | PARALLEL RESONANCE CIRCUIT | $\propto \pm$(PARALLEL RESONANCE IMPEDANCE) | $\propto \pm$(SERIES RESONANCE IMPEDANCE) |
| F | FILTER CIRCUIT | $\propto \pm$(FILTER CHARACTERISTIC IMPEDANCE) | $\propto \pm$(INVERSE-FILTER CHARACTERISTIC IMPEDANCE) |
| G | SHORT CIRCUIT | $\doteq$ short(PSEUDO-SHORT CIRCUIT) | $\doteq$ open(PSEUDO-OPEN CIRCUIT) |
| H | OPEN CIRCUIT | $\doteq$ open(PSEUDO-OPEN CIRCUIT) | $\doteq$ short(PSEUDO-SHORT CIRCUIT) |

FIG. 19

TABLE 3

|  | 70 | 71 | 72 | 73 | |
|---|---|---|---|---|---|
| BPF | D1 (E4) | D4 (E1) | D1 (E4) | D1 (E4) | Chebyshev |
| BEF | D4 (E1) | D1 (E4) | D4 (E1) | D4 (E1) | Chebyshev |
| LPF | B4 (C1) | B1 (C4) | — | B4 (C1) | NON-POLAR |
| HPF | B1 (C4) | B4 (C1) | — | B1 (C4) | NON-POLAR |
| APS | A1 (A4) | B4 | — | — | |
| DPS | A1 (A4) | B1 | — | — | |

IMMITTANCE CONVERSION CIRCUIT AND FILTER

CROSS-REFERENCE TO RELATED APPLICATION

This is the U.S. national stage of application No. PCT/JP2013/067316, filed on Jun. 25, 2013. Priority under 35 U.S.C. §119(a) and 35 U.S.C. §365(b) is claimed from Japanese Application No. PCT/JP2013/052896 filed Feb. 7, 2013, the disclosure of which is also incorporated herein by reference.

TECHNICAL FIELD

The present invention relates to a two-terminal immittance circuit which takes on a value corresponding to a gain obtained by an electronic circuit, and more particularly relates to a bidirectional circuit having floating properties.

BACKGROUND ART

An electronic circuit generally includes a circuit composed of a combination of: bidirectional two-terminal passive components such as a resistor, and a coil and a capacitor; and unidirectional three-terminal active components such as transistors.

In many cases, any of a resistive element, a capacitive element, an inductive element and the like, which are bidirectional two-terminal passive components, is a component for determining frequency characteristics of a circuit that generates desired frequency characteristics. Meanwhile, the unidirectional three-terminal active component such as a transistor has an amplification function, which the passive component does not have.

A function to change an element value of the bidirectional two-terminal passive component that is a component to determine frequency characteristics is very important to allow the circuit that generates the frequency characteristics to have desired characteristics or to change the characteristics.

A digital switch having a variable-capacitance diode and an external control terminal, or the like as a component that changes the element value of the bidirectional two-terminal passive component according to an external control signal includes two terminals as function generation terminals and a function control terminal that controls a function value thereof. Due to close electrical coupling between the function generation terminals and the function control terminal, a signal applied to the function control terminal may adversely affect the function value generated at the function generation terminals. As a result, performance and the range of use thereof are limited compared with a general bidirectional two-terminal passive component having no electrical control function for the element value.

Such limitation is eliminated if the function generation terminals and the function control terminal are electrically separated to ensure floating properties. Note that, in the present specification, such two kinds of characteristics, separation and floating properties, are collectively called floating properties.

Meanwhile, although an immittance element as a bidirectional two-terminal passive component is convenient, achievable frequency characteristics are limited due to a loss.

Patent Document 1 discloses means including a combination of transistors and a resonance circuit having loss, and configured to reduce a loss component of the resonance circuit to a desired value.

There has heretofore been known a circuit that generates two-terminal impedance when one end of the circuit is connected to a reference terminal. In this circuit, a circuit, which receives a negative feedback of a signal at an input terminal through a feedback impedance ZF, the signal outputted from an output terminal of an amplifier circuit having a gain µt, has an input impedance Zin generated between two terminals, namely, the input terminal and a reference terminal and indicated by the following formula.

[Formula 1]

$$Zin = \frac{Z_F}{1+\mu_t} \quad (1)$$

However, since the input impedance Zin is not the bidirectional floating type, this publicly known circuit can only used within a limited range.

Patent Document 2 discloses a circuit that realizes a negative inductance value. However, this circuit is not a floating circuit.

To sum up, there is a demand for a circuit that generates bidirectional floating two-terminal immittance corresponding to characteristics of a conversion target circuit, e.g., a conversion target circuit (origin circuit) that is at least a unidirectional three-terminal circuit realized using an active component such as a transistor.

PRIOR ART DOCUMENT

Patent Document

Patent Document 1: International Publication No. 2011/099438
Patent Document 2: U.S. Pat. No. 6,121,940

SUMMARY OF THE INVENTION

Problem to be Solved by the Invention

Provided is a three-terminal circuit having a third terminal (reference terminal) which generates two-terminal immittance corresponding to a gain of a conversion target circuit in a bidirectional floating state between a first terminal and a second terminal.

Means for Solving the Problem

A typical example of the invention disclosed in the present application is as follows. Specifically, an immittance conversion circuit, having a first terminal and a second terminal, includes: a conversion target circuit configured to amplify or attenuate a signal supplied to an input terminal with desired frequency and gain characteristics, and output the signal to an output terminal; a difference signal detection circuit configured to supply the input terminal of the conversion target circuit with a signal corresponding to a difference between a signal generated at the first terminal and a signal generated at the second terminal; an immittance conversion drive circuit configured to perform differential output processing to generate a positive output signal and a negative output signal for a voltage of a difference between a correction voltage and a signal corresponding to the signal outputted from the conversion target circuit, to output one of the positive output signal and the negative output signal to a first feedback signal input terminal in an immittance conversion generation circuit, and to output the other output signal to a second feedback signal input terminal in the immittance conversion generation circuit; and the immittance conversion generation circuit having an immittance conversion generation action to generate immittance to generate, at the first terminal, a signal of a sum of or a difference between currents or voltages of a feedback signal inputted to the first feedback signal input terminal and the signal inputted to the first terminal, and to generate, at the second terminal, a signal of a sum of or a difference between currents or voltages of a feedback signal inputted to the second feedback signal input terminal and the signal inputted to the second terminal. A signal corresponding to a signal of a difference between the signal generated at the first terminal and the signal generated at the second terminal is inputted to the immittance conversion drive circuit as the correction voltage.

Effects of the Invention

According to one embodiment of the present invention, a bidirectional floating immittance conversion circuit can be provided.

BRIEF DESCRIPTION OF THE DRAWINGS

FIG. 5 is a diagram showing an example of simulation results on the immittance conversion circuit according to the first embodiment.

FIG. 17 is a diagram showing circuit constants (Table 1) used in the numerical simulation.

FIG. 18 is a diagram (Table 2) for explaining the effects of the first and fourth embodiments.

FIG. 19 is a diagram (Table 3) showing combinations of resonance circuits included in the tunable filter circuit according to the fifth embodiment.

MODES FOR CARRYING OUT THE INVENTION

First, description is given of an overview of each of embodiments disclosed in the present application.

Figure 1:
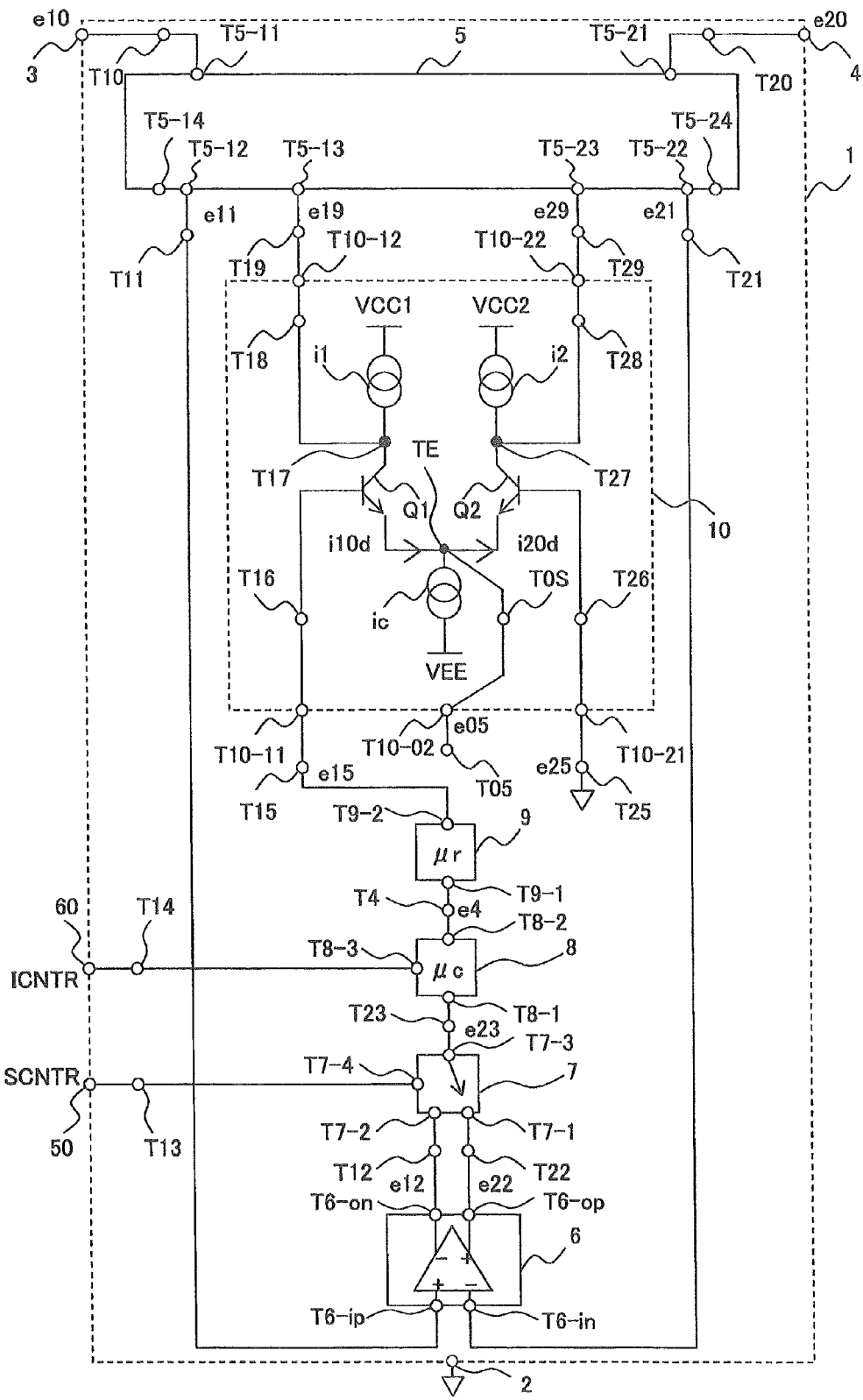
FIG. 1 is a circuit diagram of a bidirectional floating immittance conversion circuit according to a first embodiment.
Figure 2:
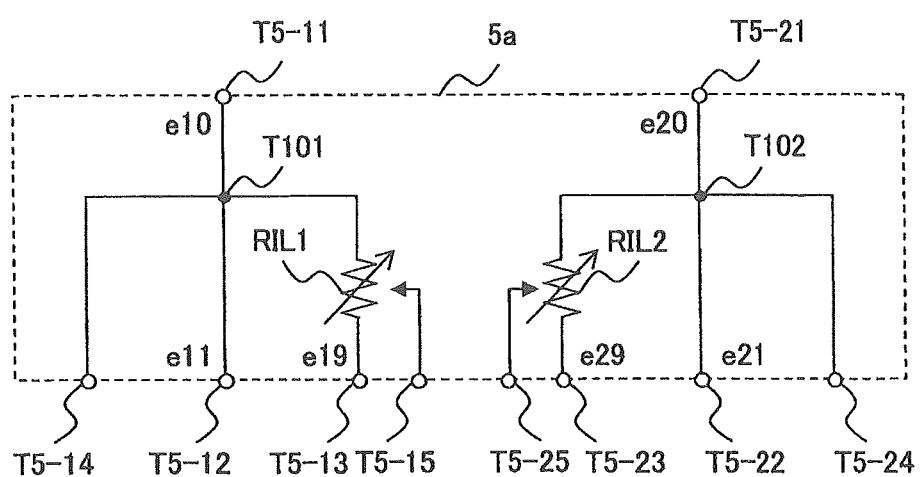
FIG. 2 is a circuit diagram of an impedance conversion generation circuit used as the immittance conversion circuit shown in FIG. 1.
Figure 3:
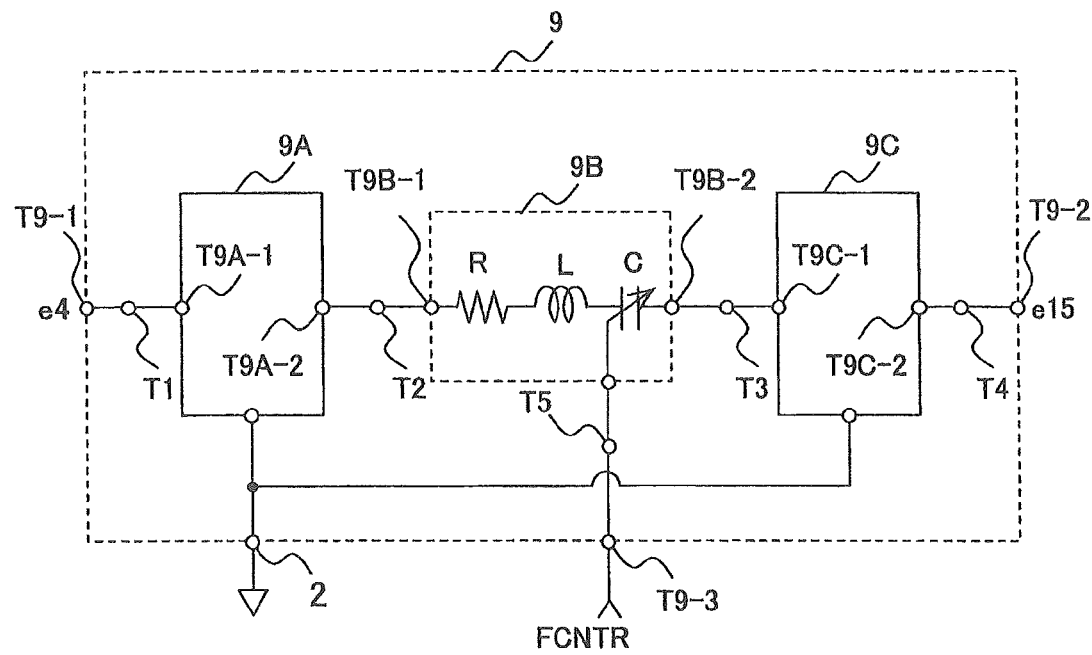
FIG. 3 is a circuit example of a conversion target circuit (origin circuit) shown in FIG. 1.

In a first embodiment, description is given of an example of using an impedance conversion generation circuit $5a$ shown in FIG. 2 as an immittance conversion generation circuit 5 included in a bidirectional floating immittance conversion circuit 1. In this case, the bidirectional floating immittance conversion circuit 1 shown in FIG. 1 also functions as an impedance conversion circuit that provides virtual short. In the following description of the embodiments, a circuit shown in FIG. 3 is used as a conversion target circuit 9 unless otherwise noted.

In second and third embodiments, description is given of examples of improved performance of the first embodiment.

Figure 11:
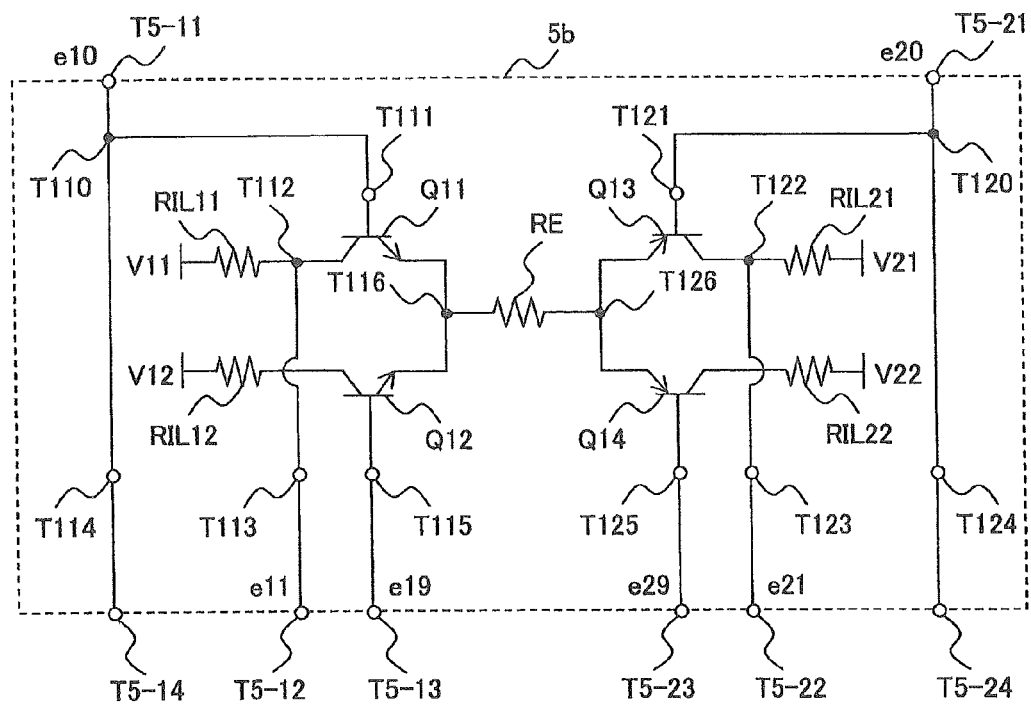
FIG. 11 is a circuit diagram of an admittance conversion generation circuit according to a fourth embodiment, which is used as an immittance conversion drive circuit shown in FIG. 1.

In a fourth embodiment, description is given of an example of using an admittance conversion generation circuit $5b$ shown in FIG. 11 as the immittance conversion generation circuit 5 included in the bidirectional floating immittance conversion circuit 1. In this case, the bidirectional floating immittance conversion circuit 1 shown in FIG. 1 also functions as an admittance conversion circuit that provides virtual open.

In a fifth embodiment, description is given of a tunable filter circuit using the first and fourth embodiments.

Embodiment 1

In the first embodiment, with reference to FIG. 1, detailed description is given of the example of using the impedance conversion generation circuit $5a$ shown in FIG. 2 as the immittance conversion generation circuit 5 included in the bidirectional floating immittance conversion circuit 1. In the first embodiment, the circuit shown in FIG. 3 is used as the conversion target circuit 9.

The bidirectional floating immittance conversion circuit 1 includes a reference terminal 2, a first terminal 3, a second terminal 4, a sign switching control input terminal 50, an immittance level control input terminal 60, the immittance conversion generation circuit 5, a difference signal detection circuit 6, a signal sign switching circuit 7, the conversion target circuit (origin circuit) 9, and an immittance conversion drive circuit 10.

The immittance conversion generation circuit 5 divides a signal e10 inputted to a terminal T5-11 through a terminal T10 from the first terminal 3, and outputs a divided signal e11 from a terminal T5-12 to a terminal T11. The immittance conversion generation circuit 5 also divides a signal e20 inputted to a terminal T5-21 through a terminal T20 from the second terminal 4, and outputs a divided signal e21 from a terminal T5-22 to a terminal T21.

A signal e19 supplied to the immittance conversion generation circuit 5 from a terminal T19 is inputted to a terminal T5-13, while a signal e29 supplied to the immittance conversion generation circuit 5 from a terminal T29 is inputted to a terminal T5-23. Note that, since the immittance conversion generation circuit 5 is symmetrically configured as shown in FIGS. 2, 11 and the like, the terminals T5-13 and T5-23 may be connected in an opposite manner.

A terminal T5-14 and a terminal T5-24 are not connected to any terminals.

Here, with reference to FIG. 2, the impedance conversion generation circuit 5a is described.

The impedance conversion generation circuit 5a includes the terminal T5-11, the terminal T5-12, the terminal T5-13 (first feedback signal input terminal), the terminal 15-14 and a terminal T5-15. The impedance conversion generation circuit 5a also includes the terminal T5-21, the terminal T5-22, the terminal 15-23 (second feedback signal input terminal), the terminal T5-24 and a terminal T5-25.

A signal supplied to the terminal T5-11 is related to the terminals T5-12, T5-13 and T5-14 through a connection point T101. Note that a first immittance level setting impedance element RIL1 is inserted between the connection point T101 and the terminal T5-13.

A signal supplied to the terminal T5-21 is related to the terminals T5-22, T5-23 and T5-24 through a connection point T102. Note that a second immittance level setting impedance element RIL2 is inserted between the connection point T102 and the terminal T5-22.

As described later, the immittance level setting impedance elements RIL1 and RIL2 set the immittance (impedance) to be generated by the immittance conversion circuit 1 (see Formulae (6), (9) and (10)).

The immittance level setting impedance elements RIL1 and RIL2 may change their values according to control signals inputted from the outside to the terminals T5-15 and T5-25, respectively. In this event, control may be performed such that the immittance level setting impedance elements RIL1 and RIL2 have the same value or that the values of the immittance level setting impedance elements RIL1 and RIL2 are in a predetermined relationship. The immittance level setting impedance elements RIL1 and RIL2 may be configured using a floating immittance conversion circuit such as that of the present invention.

The difference signal detection circuit 6 shown in FIG. 1 outputs a signal $e22=\mu6\cdot(e11-e21)$ from a positive output terminal T6-op to the terminal T22, the signal e22 corresponding to a difference signal (e11−e21) obtained by subtracting the signal e21, which is supplied from the terminal T21 to a negative input terminal T6-in, from the signal e11 supplied from the terminal T11 to a positive input terminal T6-ip. The difference signal detection circuit 6 also outputs a signal $e12=\mu6\cdot(e21-e11)$ from a negative output terminal T6-on to the terminal T12, the signal e12 corresponding to a signal e21−e11 obtained by inverting the sign of the difference signal (e11−e21) obtained by subtracting the signal e21, which is supplied from the terminal T21 to the negative input terminal T6-in, from the signal e11 supplied from the terminal T11 to the positive input terminal T6-ip. Here, $\mu6$ is a gain of the difference signal detection circuit 6, which does not impair the nature of the present invention. Thus, the following description is given assuming the case where the gain is the same both on the positive and negative sides.

Note that an output circuit may be included in the difference signal detection circuit 6, and a signal obtained by amplifying or attenuating the difference signal with a predetermined gain or a signal obtained by adding a predetermined DC voltage to the difference signal may be outputted from the difference signal detection circuit 6 as the signal corresponding to the difference signal. Alternatively, a buffer amplifier may be provided between the difference signal detection circuit 6 and the signal sign switching circuit 7 on the subsequent level, and a signal obtained by amplifying or attenuating the difference signal with a predetermined gain or a signal obtained by adding a predetermined DC voltage to the difference signal may be inputted to the signal sign switching circuit 7.

The signal sign switching circuit 7 selects one (e.g., the signal e22) of the signal e22 inputted from the terminal T22 to an input terminal T7-1 and the signal e12 inputted from the terminal T12 to an input terminal T7-2, according to the sign switching control signal SCNTR supplied to the sign switching control input terminal T7-4 through the terminal T13 from the sign switching control terminal 50, and outputs the selected signal e23 from an output terminal T7-3 to a terminal T23.

The magnitude ratio (i.e., the gain of the signal sign switching circuit 7) of the signal e22 inputted to the input terminal T7-1 of the signal sign switching circuit 7 to the signal e23 outputted from the output terminal T7-3 to a terminal T24 is $\mu7$.

The signal sign switching circuit 7 switches the sign of the output signal from the difference signal detection circuit 6, thus making it possible to determine if the feedback from the difference signal detection circuit 6 up to the conversion target circuit 9 is positive feedback or negative feedback. More specifically, if the feedback is the positive feedback, the immittance conversion generation circuit 5 generates a signal, at the first terminal 3, corresponding to the sum of currents (or voltages) of a feedback signal and a signal inputted to the first terminal 3, and generates a signal, at the second terminal 4, corresponding to the sum of currents (or voltages) of a feedback signal and a signal inputted to the second terminal 4. On the other hand, if the feedback is the negative feedback, the immittance conversion generation circuit 5 generates a signal, at the first terminal 3, corresponding to the difference in current (or voltage) between the feedback signal and the signal inputted to the first terminal 3, and generates a signal, at the second terminal 4, corresponding to the difference in current (or voltage) between the feedback signal and the signal inputted to the second terminal 4.

An immittance level variable circuit 8 amplifies or attenuates the signal e23, which is inputted to an input terminal T8-1 from the terminal T23, with a predetermined gain ($\mu c$) according to an immittance level control signal ICNTR (also called a gain control signal ICNTR) supplied to a control signal input terminal T8-3 through a terminal T14 from the immittance level control input terminal 60, and then outputs the amplified or attenuated signal e4 to a terminal T4 from an output terminal T8-2. The immittance level variable circuit 8 may be an attenuator having a control terminal for changing attenuation, a variable amplifier circuit having a control terminal for changing an amplification factor, or a combination of a variable attenuator and a variable amplifier, as appropriate.

The magnitude ratio (i.e., the gain of the immittance level variable circuit 8) of the signal e23 inputted to the input terminal T8-1 of the immittance level variable circuit 8 to the signal e4 outputted from the output terminal T8-2 to the terminal T4 is $\mu8$.

The conversion target circuit (origin circuit) 9 amplifies or attenuates the signal e4, which is inputted to an input terminal T9-1 from the terminal T4, with a desired gain ($\mu r$), and outputs the amplified or attenuated signal e15 to a terminal T15 from an output terminal T9-2.

More specifically, the conversion target circuit 9 is a circuit that generates desired transmission characteristics (gain). The conversion target circuit that generates the desired transmission characteristics (gain) is either a two-terminal circuit including an input terminal and an output terminal or a three-terminal circuit including an input terminal, an output terminal and a reference terminal. The conversion target circuit shown in FIG. 3 is a three-terminal circuit having a two-terminal impedance disposed in a serial branch.

The conversion target circuit 9 is a circuit obtained by combining passive components, active components and the like, which can be approximately expressed by a combination of passive components such as a resistor, a coil and a capacitor, or a combination of equivalent circuits or passive components. The conversion target circuit 9 is a circuit that generates the desired gain pr between the input terminal T9-1 and the output terminal T9-2. The absolute value of the desired gain pr may be smaller than 1.

More specifically, the conversion target circuit (origin circuit) 9 amplifies or attenuates the signal e4, which is inputted to the input terminal T9-1 from the terminal T4, with the desired gain (pr), and outputs the amplified or attenuated signal e15 to the terminal T15 from the output terminal T9-2.

Note that an output circuit may be included in the immittance level variable circuit 8 or the conversion target circuit 9, and a signal amplified or attenuated with a predetermined gain or a signal to which a predetermined DC voltage is added may be outputted as a signal corresponding to a signal to be outputted. Alternatively, a buffer amplifier may be provided between the immittance level variable circuit 8 or the conversion target circuit 9 and a circuit on the subsequent level, and a signal amplified or attenuated with a predetermined gain or a signal to which a predetermined DC voltage is added may be inputted to the circuit on the subsequent level. Moreover, the arrangement order of the signal sign switching circuit 7, the immittance level variable circuit 8 and the conversion target circuit 9 which is disposed between the difference signal detection circuit 6 and the immittance conversion drive circuit 10 is arbitrary. However, the signal sign switching circuit 7 may be replaced by a phase inverter if necessary.

The immittance conversion drive circuit 10 performs an immittance conversion drive operation on the signal e15 supplied to a terminal T10-11 from the terminal T15 and a signal e25 supplied to a terminal T10-21 from a terminal T25, thereby generating signals e19 and e29 subjected to the immittance conversion drive operation. Then, the immittance conversion drive circuit 10 outputs the signal e19 to a terminal T19 from a terminal T10-12, and also outputs the signal e29 to a terminal T29 from a terminal T10-22.

The terminal T25 is connected to the reference terminal 2, while the terminal T10-02 is not connected to any terminal. A reference potential (e.g., 0 volts) is applied to the reference terminal 2. Note that the reference voltage may be an arbitrary DC voltage or a voltage modulated with an arbitrary AC signal.

With reference to FIG. 3, a circuit example of the conversion target circuit 9 is specifically described. When the immittance conversion generation circuit 5a shown in FIG. 2 is used and the conversion target circuit 9 shown in FIG. 3 is further used, the two-terminal impedance takes the minimum value corresponding to the peak of frequency characteristics of the total gain μta of the entire circuit shown in FIG. 1, as the two-terminal immittance. In other words, a circuit is realized, which generates impedance having frequency characteristics equivalent to impedance generated by a series resonance circuit including a coil and a capacitor.

The conversion target circuit 9 shown in FIG. 3 includes a low-output impedance amplifier circuit 9A, a resonance circuit 9B, and a low-input impedance amplifier circuit 9C. Note that the conversion target circuit (origin circuit) 9 may include no reference terminal 2.

The low-output impedance amplifier circuit 9A outputs a signal, which is inputted to an input terminal T9A-1, to an output terminal T9A-2 through a terminal T1 from the input terminal T9-1. The low-output impedance amplifier circuit 9A is provided to eliminate the influence of impedance of an external circuit on the input side on characteristics (e.g., Q) of the resonance circuit 9B.

The resonance circuit 9B outputs a signal, which is obtained by performing resonant response processing on a signal inputted to an input terminal T9B-1 through a terminal T2 from the output terminal T9A-2, to an output terminal T9B-2.

More specifically, in the resonance circuit 9B, a resistor R, a coil L and a capacitor C are connected in series between the input terminal T9B-1 and the output terminal T9B-2. Loss components of the coil L and the capacitor C are equivalently included in the resistor R. The capacitor C can change a capacitance value C according to a reactance control signal FCNTR inputted to a reactance control input terminal T9-3. When the capacitance value C is changed according to the reactance control signal FCNTR, the resonance frequency of the resonance circuit 9B is changed. Thus, the reactance control signal FCNTR is equivalent to a frequency control signal.

The ratio of the signal e4 supplied to the input terminal T9-1 to the signal e15 outputted from the output terminal T9-2 is the gain pr (may be called μ9). μr has frequency dependence.

The low-input impedance amplifier circuit 9C amplifies a signal inputted to an input terminal T9C-1 through a terminal T3 from the output terminal T9B-2, and outputs the amplified signal to an output terminal T9C-2 through the terminal T4 from the output terminal T9C-2. The low-input impedance amplifier circuit 9C is provided to eliminate the influence of impedance of an external circuit on the output side on the characteristics (e.g., Q) of the resonance circuit 9B.

The signal inputted to the terminal T10-11 of the immittance conversion drive circuit 10 shown in FIG. 1 is supplied to a base of a transistor Q1 through a terminal T16, while the signal supplied to the terminal T10-21 is supplied to a base of a transistor Q2 through a terminal T26.

An emitter of the transistor Q1 and an emitter of the transistor Q2 are connected to each other at a connection point TE. The connection point TE is connected to a DC power supply VEE through a constant current source ic, and is further connected to the terminal T10-02 through a terminal T0S. Also, a current source of an operation amplifier circuit is connected to the connection point TE. The connection point TE connects the transistors Q1 and Q2, and becomes an intermediate point between the two transistors.

A collector of the transistor Q1 is connected to one of terminals of a constant current source i1 through a connection point T17, and the other terminal of the constant current source i1 is connected to a DC power supply Vcc1. The connection point T17 is further connected to the terminal T10-12 through a terminal T18.

A collector of the transistor Q2 is connected to one of terminals of a constant current source i2 through a connection point T27, and the other terminal of the constant current source i2 is connected to a DC power supply Vcc2. The connection point T27 is further connected to the terminal T10-22 through a terminal T28.

Note that resistors may be disposed between the emitter of the transistor Q1 and the point TE and between the emitter of the transistor Q2 and the point TE. The resistors may have relatively small resistance values.

The constant current source between the point TE and the DC power supply VEE may be replaced by a resistor. The resistor may have a relatively large resistance value.

Also, the collectors of the two transistors may be driven by a current mirror circuit.

Moreover, the immittance conversion drive circuit 10 is included in a differential input/output circuit.

The terminal T10-12 is connected to the terminal T5-13 of the immittance conversion generation circuit 5 through a terminal T19, while the terminal T10-22 is connected to the terminal T5-23 of the immittance conversion generation circuit 5 through a terminal T29.

A quotient obtained by dividing the signal generated at the terminal T10-12 by the signal inputted to the terminal T10-11 is defined as a gain $\mu 5$. Note that a quotient obtained by dividing the signal generated at the terminal T10-22 by the signal applied to the terminal T10-21 also becomes substantially equivalent to the gain $\mu 5$.

Next, description is given of operations of the immittance conversion circuit 1 according to the first embodiment, based on a result of numerical simulation. As to the numerical simulation, description is given of the bidirectional floating immittance conversion circuit 1 using the impedance conversion generation circuit 5a shown in FIG. 2 as the immittance conversion generation circuit 5. Although the conversion target circuit 9 can be arbitrarily selected, the conversion target circuit 9 shown in FIG. 3 that is an example of the case where a resonance peak phenomenon appears in the gain frequency characteristics is used here. As for the circuit constant used in the numerical simulation, the values shown in Table 1 (FIG. 17) are used. A series resistor R in the conversion target circuit 9 is included in output impedance of the amplifier circuit 9a and input impedance of amplifier circuit 9c.

Figure 4:
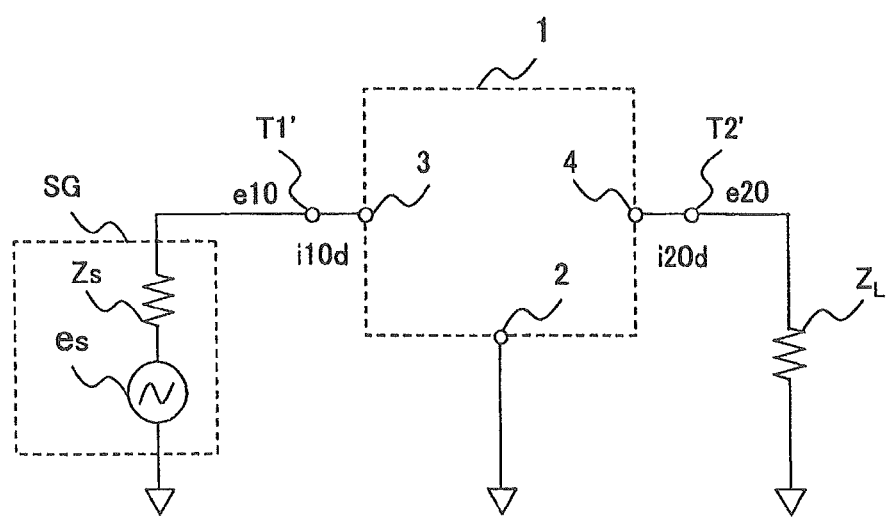
FIG. 4 is a diagram showing an example of a peripheral circuit used for numerical simulation.

Also, a test circuit shown in FIG. 4 is used as a test circuit (peripheral circuit) to confirm characteristics of a generated two-terminal impedance $z_0$. In the test circuit, a standard signal generator SG of an output impedance $Z_S$ is connected through a terminal T1' between the first terminal 3 and the reference terminal 2 in the immittance conversion circuit 1. Furthermore, a load resistor $Z_L$ is connected through a terminal T2' between the second terminal 4 and the reference terminal 2. The values of the output impedance $Z_S$ and the load impedance $Z_L$ are based on 50Ω, and may be varying parameters.

The results of the numerical simulation are as follows.

First, when the first terminal 3 and the second terminal 4 are switched in the test circuit shown in FIG. 4, it can be confirmed that the value of the two-terminal impedance z0 is not changed and the bidirectionality is satisfied.

Secondly, even when the value of the load impedance $Z_L$ in the test circuit is changed to 200 Ω, 50Ω and 0Ω (short-circuit), the value of the two-terminal impedance $z_0$ is not changed. This means that a current i10d flowing from the first immittance level setting impedance element RIL1 shown in FIG. 2 toward the connection point TE through the transistor Q1 shown in FIG. 1 and a current i20d flowing from the second immittance level setting impedance element RIL2 toward the connection point TE through the transistor Q2 shown in FIG. 1 have signs opposite to each other and have the same absolute value (i.e., currents of the same magnitude flow in the same direction). Therefore, even if the load impedance is changed, no current flows into the connection point TE from the constant current source ic, and no current flows out to the constant current source ic. Thus, the potential of the connection point TE is always (e10+e20)×0.5. Accordingly, it can be confirmed that the floating properties are satisfied.

Third, with reference to FIG. 5, description is given of the fact that the two-terminal impedance is dependent on the first immittance level setting impedance element RIL1, the second immittance level setting impedance element RIL2 and the total gain μta, i.e., the same frequency characteristics as those of the conversion target circuit 9 can be obtained. Note that the first and second immittance level setting impedance element RIL1 and RIL2 are equivalently set to RIL.

The horizontal axis in FIG. 5(a) represents the frequency of the signal inputted to the first terminal 3 shown in FIG. 4, which is swept from 9,900,000 Hz to Ser. No. 10/100,000 Hz. An input voltage is set to 1V.

The vertical axis in FIG. 5(a) represents the absolute value of the two-terminal impedance $z_0$ obtained by dividing a difference voltage (e10−e20) between the voltage e10 of the first terminal 3 and the voltage e20 of the second terminal 4 shown in FIG. 4 by the current flowing from the first terminal 3 toward the second terminal 4. The impedance is changed to three values, 200 Ω, 100Ω and 50Ω, using the immittance level setting impedance RIL as a parameter.

From the three curves shown in FIG. 5(a), it can be confirmed that the value of the two-terminal impedance $z_0$ is increased proportional to the three values of the immittance level setting impedance RIL. Moreover, at 10 MHz that is the frequency of the maximum gain corresponding to the maximum output voltage of the conversion target circuit 9 shown in FIG. 3, the value of the two-terminal impedance $z_0$ takes the minimum value. Thus, it can be confirmed that the value of the two-terminal impedance $z_0$ is inversely proportional to the total gain μta.

Next, with reference to FIG. 5(b), description is given of the fact that the phase characteristic of the two-terminal impedance $z_0$ can be inverted between positive and negative according to a sign switching control signal SCNTR applied to the signal sign switching circuit 7.

The vertical axis in FIG. 5(b) represents the phase of the current at the terminal T2' in the test circuit shown in FIG. 4, and the unit thereof is "degree". The horizontal axis represents the same as that of FIG. 5(a). The immittance level setting impedance RIL is 100Ω. The phase of the current is indicated by the solid line A and the broken line B according to the sign switching control signal SCNTR. To be more specific, the solid line A represents characteristics that the phase is reduced as the frequency is increased. On the other hand, the broken line B represents characteristics that the phase is increased as the frequency is increased.

The characteristics represented by the broken line B are those that cannot be realized by a normal combination of passive components. Such characteristics can be realized by combining transistors as active components, in addition to the coil and capacitor as the passive components, in FIG. 1.

<Positive Feedback Operation and Negative Feedback Operation>

A voltage differential between the voltage e10 applied to the first terminal 3 and the voltage (first feedback voltage) e19 outputted from the collector of the transistor Q1 in the immittance conversion drive circuit 10 is applied to one of the immittance level setting impedance elements RIL1 and RIL2 in the impedance conversion generation circuit 5a shown in FIG. 2. Meanwhile, a voltage differential between the voltage e20 applied to the second terminal 4 and the voltage (second feedback voltage) e29 outputted from the collector of the transistor Q2 in the immittance conversion drive circuit 10 is applied to the other one of the immittance level setting impedance elements RIL1 and RIL2. This means that the first feedback signal (voltage) for the immittance level setting impedance element RIL1 and the second feedback signal (voltage)

for the immittance level setting impedance element RIL2 are added or subtracted as currents.

This circuit form corresponds to an input-side (current) parallel feedback circuit form in a feedback circuit having one end connected to the reference terminal.

Here, connection that increases the absolute value of a difference between the voltages generated at both ends of the first and second immittance level setting impedance element RIL1 and RIL2 is called "positive feedback connection", while connection that reduces the absolute value thereof is called "negative feedback connection".

The connection mode shown in FIGS. 1 and 2 is "positive feedback connection" since the voltage generated at the first terminal 3 increases the absolute value of a difference between the voltages generated at the both ends of the first immittance level setting impedance element RIL1.

This is because the voltages generated at the terminals T5-11 and T5-13 in FIG. 2 have the same phase, and the phase of the signal from the terminal T5-12 to the terminal T5-13 in FIG. 1 is the reverse phase. Therefore, in FIG. 1, the number of equivalent phase inverters (the number thereof to be inserted) needs to be an odd number. Likewise, the phase of the signal from the terminal T5-22 to the terminal T5-23 is the reverse phase, and the number of phase inverters is an odd number.

The number of phase inverters may be set to be an even number to realize "negative feedback connection". Therefore, switch selection by the signal sign switching circuit 7, for example, may be put into the negative feedback side.

Therefore, the selection between the positive feedback connection and the negative feedback connection is determined by the switch selection by the signal sign switching circuit 7 and the number of phase inverters. Here, when the amount of phase rotation by the phase inverter is different from the integral multiple (including zero multiple) of π, a phase shift circuit may be provided at an appropriate position in the circuit to adjust the phase rotation amount to be the integral multiple of n.

Figure 6:
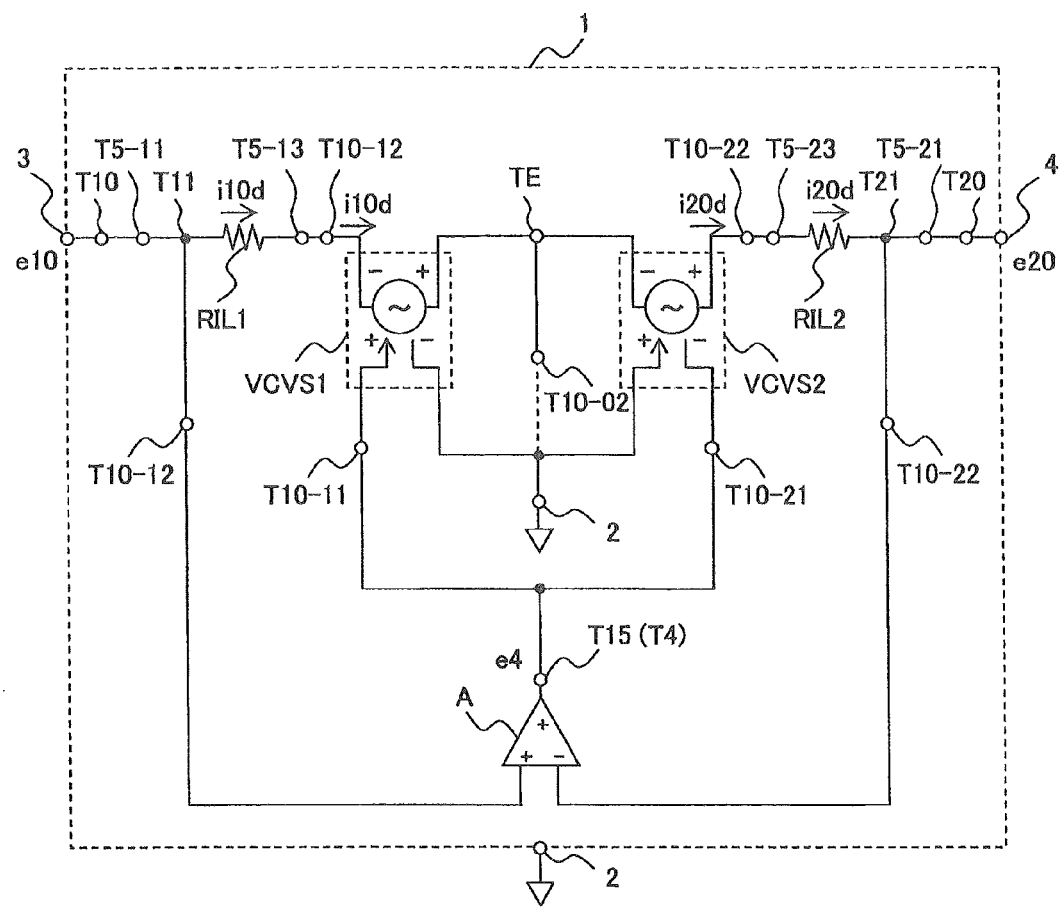
FIG. 6 is a diagram showing an example of an equivalent circuit used to explain operations of the immittance conversion circuit according to the first embodiment.

Next, description is given of the operations of the circuit shown in FIG. 1, with reference to FIG. 6 and formulae, in the case of adopting the configuration shown in FIG. 2 for the immittance conversion generation circuit 5. The terminals and constituent components in FIGS. 1, 2 and 6 are denoted by the corresponding reference numerals.

An equivalent circuit shown in FIG. 6 includes a reference terminal 2, a first terminal 3 and a second terminal 4. The product of gains of two voltage-controlled voltage sources VCVS1 and VCVS2 and a gain of a differential detection circuit A is the total gain μta.

Prior to analysis of formulae, the total gain μta is defined. The total gain μta is the product of gains (μ5, μ6, μ7, μ8, μ9 and μ10) of the respective element circuits shown in FIG. 1, and is generally a complex number. Each of the gains may be a positive gain (amplified gain) or a negative gain (attenuated gain).

An additional character (i=1, 2) is attached to the total gain μta. The total gain μta is expressed as μtai, so that the total gain μta is differentiated between the first terminal 3 side and the second terminal 4 side. Using the total gain μtai, a current $i_{10d}$ through which the signal supplied to the terminal T5-11 in the impedance conversion generation circuit 5a shown in FIG. 2 from the first terminal 3 flows toward the connection point TE through the emitter of the transistor Q1 from the terminal T10-12 in the immittance conversion drive circuit 10 shown in FIG. 1 and a current $i_{20d}$ through which the signal flows toward the second terminal 4 from the connection point TE are expressed by Formula (2).

[Formula 2]

$$\begin{pmatrix} i_{10d} \cdot R_{IL1} \\ i_{20d} \cdot R_{IL2} \end{pmatrix} = \begin{pmatrix} 1 + \pm \mu_{ta1} & \pm \mu_{ta1} \\ \mp \mu_{ta2} & 1 + \pm \mu_{ta2} \end{pmatrix} \begin{pmatrix} e_{10} \\ e_{20} \end{pmatrix} \quad (2)$$

In Formula (2), if total gain conditions expressed by Formula (3) are satisfied, the approximation formula of Formula (4) is true for the current $i_{10d}$ and the current $i_{20d}$.

[Formula 3]

$$1 \langle\langle |\mu_{tai}| (i = 1, 2) \quad (3)$$

[Formula 4]

$$\begin{pmatrix} i_{10d} \cdot R_{IL1} \\ i_{20d} \cdot R_{IL2} \end{pmatrix} \cong \begin{pmatrix} \pm \mu_{ta1} & \mp \mu_{ta1} \\ \mp \mu_{ta2} & \pm \mu_{ta2} \end{pmatrix} \begin{pmatrix} e_{10} \\ e_{20} \end{pmatrix} \quad (4)$$

Furthermore, if "first balance conditions" expressed by Formula (5) are satisfied, the current $i_{10d}$ and the current $i_{20d}$ coincide with each other.

[Formula 5]

$$\frac{\pm \mu_{ta1}}{R_{IL1}} = \frac{\pm \mu_{ta2}}{R_{IL2}} \quad (5)$$

Therefore, even though the voltage e10 generated at the first terminal 3 and the voltage e20 generated at the second terminal 4 are any voltage, no current flows into the reference terminal 2 through the terminal T10-02 from the connection point TE. This means that the immittance conversion circuit 1 is a "floating circuit".

Next, when the two immittance level setting impedance elements RIL1 and RIL2 have the same impedance, an input impedance zin10d when looking toward the connection point TE from the terminal T5-11 and an input impedance zin20d when looking toward the connection point TE from the terminal T5-21 both have the same value. This means that the immittance conversion circuit 1 is a "bidirectional circuit".

Under such conditions, a two-terminal impedance z0 is expressed by Formula (6) where RIL represents the case where RIL1 and RIL2 are the same and μta represents the case where μta1 and μta2 are the same.

[Formula 6]

$$Z_0 = 2 \cdot \frac{R_{IL}}{\pm \mu_{ta}} \quad (6)$$

In Formula (6), the gain μta is divided into a component having frequency characteristics and a component having no frequency characteristics, and at least the component having no frequency characteristics is significantly variable.

Next, detailed description is given of the effects of the bidirectional floating the immittance conversion circuit 1. Formula (6) means the following thing.

According to the connection mode (negative feedback connection or positive feedback connection) and the positive or negative of the total gain μta, the two-terminal impedance z0 can take a positive or negative value. This means that the immittance conversion circuit 1 realizes an inductive element, a capacitive element, a resistive element and the like having negative impedance, and that impedance characteristics that cannot be realized only by passive components are realized.

The impedance value of the immittance conversion circuit 1 is proportional to the impedance value of the immittance level setting impedance element RIL. Thus, if an element having a reactance value is adopted as the immittance level setting impedance element RIL, the immittance conversion circuit 1 generates the two-terminal impedance z0 proportional to the reactance value.

The absolute value of the total gain μta may be not less than 1 (i.e., amplifier circuit) or less than 1 (i.e., attenuation circuit).

A gain μ9 of the conversion target circuit 9 shown in FIG. 3 has a resonance peak phenomenon. The resonance peak phenomenon is described in detail with reference to FIG. 7.

Figure 7:
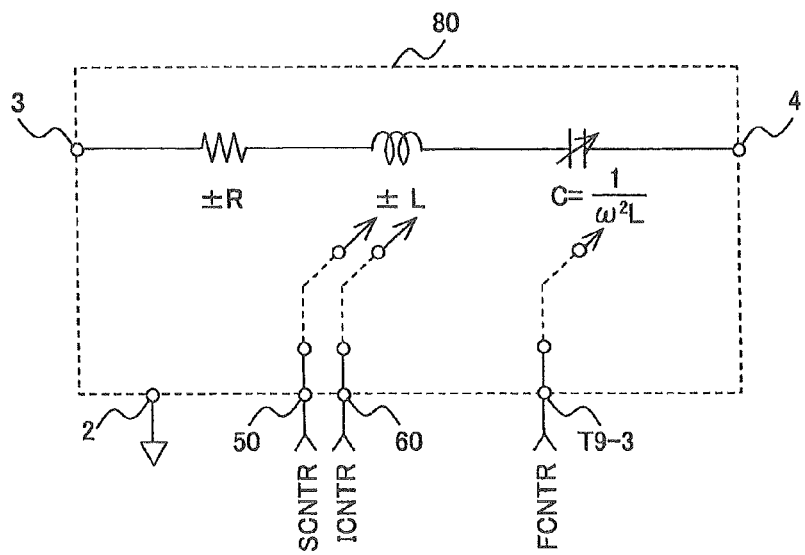
FIG. 7 is a diagram showing an example of effects of the immittance conversion circuit according to the first embodiment.

Using an equivalent circuit, the two-terminal impedance z0 in the immittance conversion circuit 1 can be expressed as a series circuit including a resistive element, an inductive element and a capacitive element, as shown in FIG. 7. This equivalent circuit includes a reference terminal 2, a first terminal 3 and a second terminal 4. The equivalent circuit further includes a sign switching control input terminal 50 for inputting a sign switching control signal SCNTR, an immittance level control input terminal 60 for inputting an immittance level control signal ICNTR, and a frequency control input terminal T9-3 for inputting a frequency control signal FCNTR.

The sign switching control signal SCNTR can simultaneously switch signs of the both inductive element and capacitive element so that the signs are inverted between positive and negative.

The immittance level control signal ICNTR can simultaneously change element values of the inductive element and capacitive element. In this event, a resonance frequency ω with the two element values remains constant. The equivalent circuit shown in FIG. 7 shows the case where the element value of the inductive element is L and the resonance frequency is ω as two independent control amounts. The resonance frequency ω can vary according to the frequency control signal FCNTR.

Furthermore, the sign and absolute value of the element value ±R of the resistive element can vary according to an unillustrated control signal.

Next, the effects of the first embodiment are further described with reference to Table 2 (FIG. 18). The effects of the present invention are extensive (e.g., the immittance level setting impedance elements RIL1 and RIL2 may be capacitors or inductors). Thus, description is given of an example where some of the values thereof, i.e. the element value RIL of the impedance level setting impedance is the real number (resistance value).

Although Table 2 also shows an example of effects of a fourth embodiment, description thereof is given later.

The first column of Table 2 shows elements having control over the frequency characteristics of the conversion target circuit 9 shown in FIG. 3. The second column shows the two-terminal impedance z0 corresponding to the elements. Here, R has no frequency dependency. L is an inductance having control over a reactance value proportional to the frequency. C is a capacitance having control over the reactance value inversely proportional to the frequency. Those with a "−" (negative) sign, e.g., "−R" represents a negative resistance. As to the reactance characteristics indicated by "−L", "−C", "−(series resonance impedance)" and the like, the slope of any of the reactance values is negative with respect to an increase in frequency. Such a characteristic cannot be obtained using only a passive circuit.

"Inverse-filter characteristic impedance" is a value having characteristics inversely proportional to "filter characteristics".

Moreover, when both of the first and second immittance level setting impedance elements RIL1 and RIL2 are inductive elements or capacitive elements, values obtained by multiplying the values in Table 2 by j are obtained. Here, j is an imaginary unit, and ω is an angular frequency. Also, ∝ means proportionality.

The value of the two-terminal impedance z0 can change complex impedance corresponding to an extensive change in total gain by changing the element value of the impedance control element RIL, the absolute value of the total gain μta including the gain of the conversion target circuit, and at least one of the signs thereof according to an external signal.

If the total gain μta is sufficiently large and does not have extreme frequency characteristics (e.g., zero point or pole) that affect μr, desired two-terminal impedance z0 is 0 (zero), and the immittance conversion circuit 1 is included in a so-called pseudo-short circuit.

It can be said that, by realizing a bidirectional floating two-terminal impedance circuit proportional or inversely proportional to the total gain μta including the gain of the conversion target circuit 9 that can be expressed by various four-terminal matrices also using an amplifier circuit, one of element circuits to realize a balanced circuit (circuit network that can be expressed by an eight-terminal matrix) with excellent noise tolerance is provided.

By reducing unnecessary real number components in the gain obtained by the conversion target circuit 9, a bidirectional floating series resonance circuit can be realized, which mainly includes imaginary components of the gain, for example, and has a large effective Q value.

As described above, the bidirectional floating immittance conversion circuit according to the first embodiment of the present invention is the three-terminal circuit having the first terminal, the second terminal and the reference terminal, and generates the two-terminal immittance, i.e., impedance $z_0$ corresponding to the total gain including the gain of the conversion target circuit, between the first and second terminals. The immittance conversion circuit achieves the following effects.

First, no current flows through the current circuit including the reference terminal, due to the level of the signals applied to or generated at the first and second terminals. Secondly, no current flows through the current circuit including the reference terminal, due to the immittance level of the peripheral circuit connected to the first and second terminals. The two effects described above cause the immittance conversion circuit to float from the peripheral circuit.

Third, the immittance characteristics of the immittance conversion circuit do not change even if the first and second terminals are switched. Thus, the immittance conversion circuit is bidirectional.

Fourth, two-terminal immittance characteristics corresponding to the total gain μta including the gain of the conversion target circuit are generated, according to the form of the immittance conversion generation circuit, between the first and second terminals. In other words, the gain of the immittance conversion circuit can be arbitrarily set.

Embodiment 2

In the first embodiment, the description is given of the case where the conditions of Formula (3) are satisfied when the value of the total gain μta is large. In a second embodiment, description is given of a bidirectional floating immittance conversion circuit 1 in the case where the value of the total gain μta extensively changes, i.e., a correspondence relationship between the two-terminal impedance $z_0$ and the total gain μta of the conversion target circuit always includes the same constant term element for all elements in the coefficient matrix on the right-hand side of Formula (2) even if the value of the total gain μta is small.

Figure 8:
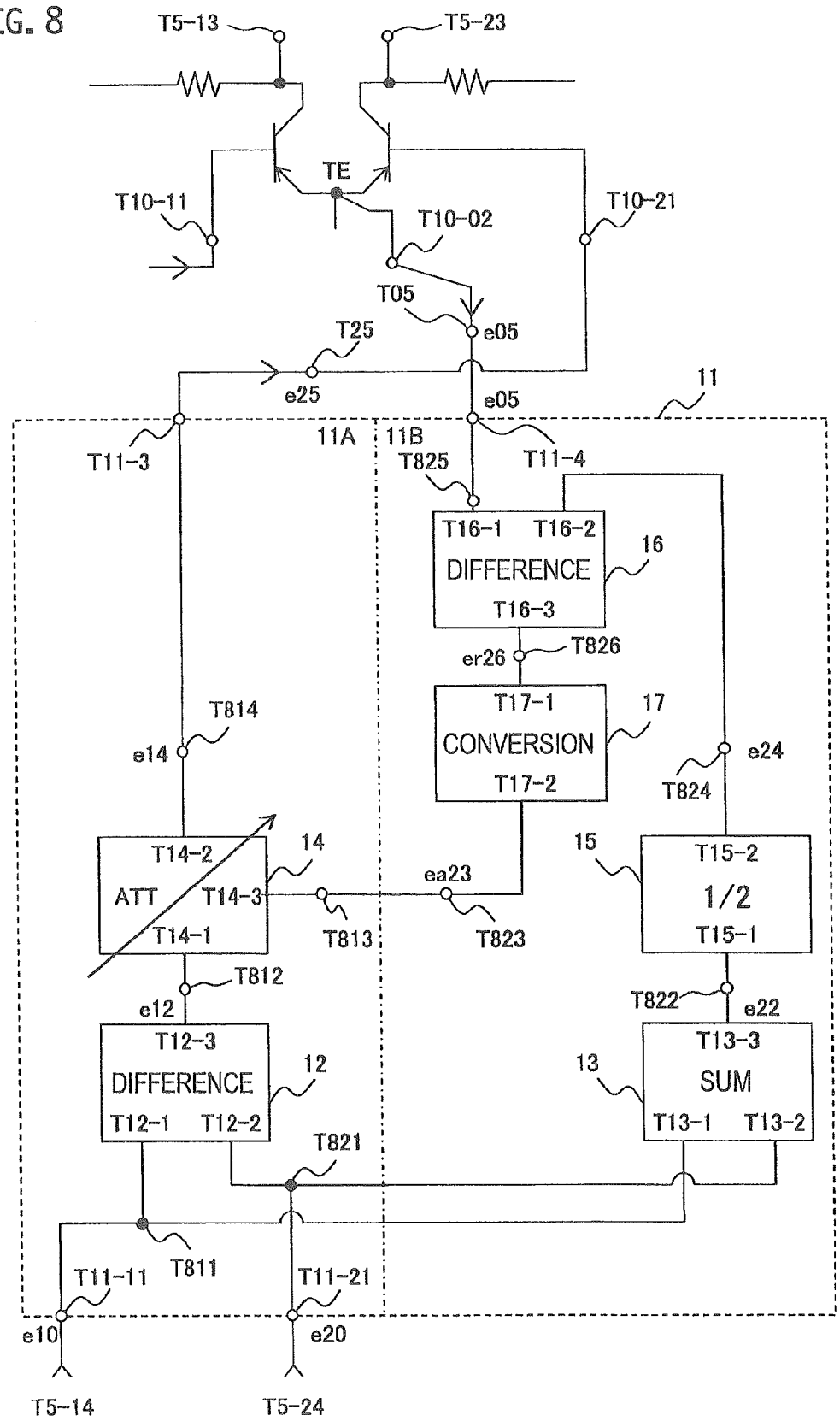
FIG. 8 is a circuit diagram of a signal correction circuit according to a second embodiment.

In order to achieve such an effect, a predetermined correction signal from a signal correction circuit (also called an immittance conversion control circuit) shown in FIG. 8 is supplied to the terminal T10-21 in the bidirectional floating immittance conversion circuit 1 shown in FIG. 1. As a result, the floating effect of the immittance conversion circuit 1 shown in FIG. 1 is realized regardless of the value of μta.

First, connection between the both circuits is described. The signal correction circuit 11 includes an input terminal T11-11, an input terminal T11-21, an output terminal T11-3 and a detection signal input terminal T11-4. These four terminals are connected to the immittance conversion circuit 1 shown in FIG. 1 through the following two steps.

In the first step, the connection between the terminal T25 (reference potential) and the terminal T10-21 shown in FIG. 1 is cut off.

Next, in the second step, the signal correction circuit 11 shown in FIG. 8 is connected to the bidirectional floating immittance conversion circuit 1 through the following procedures.

First, the input terminal T11-11 shown in FIG. 8 is connected to the terminal T5-14 shown in FIG. 1, the input terminal T11-21 shown in FIG. 8 is connected to the terminal T5-24 shown in FIG. 1, the output terminal T11-3 shown in FIG. 8 is connected to the terminal T10-21 shown in FIG. 1, and the detection signal input terminal T11-4 shown in FIG. 8 is connected to the terminal T10-02 through the terminal T05 shown in FIG. 1.

Next, with reference to FIG. 8, the signal correction circuit 11 is described.

The signal correction circuit 11 includes a difference signal generation circuit 12, a sum signal generation circuit 13, a variable attenuation circuit 14, a variable attenuation circuit 15, a difference signal generation circuit 16 and a control signal generation circuit 17.

The difference signal generation circuit 12 outputs a difference signal e12=e10−e20, between a signal e10 supplied to an input terminal T12-1 through a connection point T811 from the input terminal T11-11 and a signal e20 supplied to an input terminal T12-2 through a connection point T821 from the input terminal T11-21, to a terminal T812 from an output terminal T12-3. The higher the input impedance of the both input terminals T12-1 and T12-2, the higher the floating properties of the present invention.

The sum signal generation circuit 13 outputs a sum signal e22=e10+e20, of a signal e10 supplied to an input terminal T13-1 through the connection point T811 from the input terminal T11-11 and a signal e20 supplied to an input terminal T13-2 through the connection point T821 from the input terminal T11-21, to a terminal T22 from an output terminal T13-3. The higher the input impedance of the both input terminals T13-1 and T13-2, the higher the floating properties of the present invention.

The variable attenuation circuit 14 outputs a signal e14 to the output terminal T11-3 through a terminal T814 from an output terminal T14-2, the signal e14 being obtained by attenuating the signal e12 inputted to an input terminal T14-1 from the terminal T812 according to a signal from an attenuation amount control input terminal T14-3. The attenuation amount of the variable attenuation circuit 14 may be a value adjusted such that the voltage at the point TE is ½(0.5×(e10+e20)) of the sum of the voltage e10 generated at the first terminal 3 and the voltage e20 generated at the second terminal 4. Although not shown, the variable attenuation circuit 14 may be a variable amplifier circuit.

An example of a predetermined target for attenuation amount adjustment by the variable attenuation circuit 14 is to output the correction signal e14 from the output terminal T14-2, the correction signal e14 being such that the values of the signals inputted to the terminals T5-13 and T5-23 in the immittance conversion generation circuit 5 is larger by a factor of μta than that of the difference signal (e10−e20) at the input terminal 114-1, i.e., μta×(e10−e20) and −μta×(e10−e20).

The variable attenuation circuit 15 outputs a signal e24 to a terminal T824 from an output terminal T15-2, the signal e24 being obtained by attenuating the signal e22 inputted to an input terminal T15-1 from a terminal T822 by a semi-fixed predetermined attenuation amount (e.g., ½).

An example of a predetermined target for attenuation amount adjustment by the variable attenuation circuit 15 is to output the output signal e24 from the output terminal T15-2, the output signal e24 being such that the value of the signal inputted to a terminal T16-2 in the difference signal generation circuit 16 is ½ of the sum signal (e10+e20) at the input terminal T15-1, i.e., the value of the signal inputted to the terminal 116-2 in the difference signal generation circuit 16 is 0.5×(e10+e20). In order to manage the attenuation amount 0.5, attenuation amount adjustment by the variable attenuation circuit 15 may be required.

The difference signal generation circuit 16 outputs an error signal er26 to a terminal T826 from an output terminal T16-3, the error signal er26 being a difference between a signal e05 supplied to an input terminal 116-1 through a terminal 1825 from the detection signal input terminal T11-4 and a signal (e.g., a signal having a value that is ½ of that of the sum signal) e24 obtained by attenuating the sum signal inputted to an input terminal T16-2 from a terminal T824.

The control signal generation circuit 17 generates an attenuation amount control signal ea23 so as to minimize the absolute value of the error signal er26 inputted to an input terminal T17-1 from the terminal T826, and outputs the attenuation amount control signal ea23 to a terminal T823 from an output terminal T17-2. The attenuation amount control signal ea23 is inputted to the attenuation amount control input terminal T14-3 in the variable attenuation circuit 14 through a terminal T813 from the terminal T823.

In the second embodiment, the description is given of the example where a predetermined correction signal from the output terminal T11-3 in the signal correction circuit (also called the immittance conversion control circuit) 11 is inputted to the terminal T10-21 in the bidirectional floating immittance conversion circuit 1 shown in FIG. 1. However, the output terminal T11-3 may be connected to the terminal T10-21 or the terminal T10-11. In this event, the output signal e15 from the output terminal in the conversion target circuit 9 is connected to either the terminal T10-11 or the terminal T10-21, to which the output terminal T11-3 in the signal correction circuit 11 is not connected.

Next, description is given of operations of an automatic control system for generating a predetermined correction signal e14. The automatic control system is intended to supply a signal corresponding to the difference signal (e10−e20) to the terminal T10-21 in the immittance conversion drive circuit 10, a signal of μta×(e10−e20) to the terminal T5-13 in the immittance conversion generation circuit 5, a signal of −μta×(e10−e20) to the terminal T5-23, in order to minimize the current flowing out to the reference terminal 2 from the point TE in the immittance conversion drive circuit 10. This coefficient needs to be managed to be always μta.

As a result of managing the coefficient to be μta, the absolute value of a difference between the signal level at the point TE in the immittance conversion drive circuit 10 and the average value 0.5×(e10+e20) of the signals applied to the first terminal 3 and the second terminal 4 is minimized (note that zero is an ideal value).

The attenuation amount control signal ea23 in the automatic control system may be a secondary degenerate control signal rather than a zero-cross automatic control signal.

Next, description is given of the fact that the attenuation amount adjustment by the variable attenuation circuit 14 in the signal correction circuit 11 shown in FIG. 8 does not have to be dynamic.

The signal correction circuit 11 can be divided into two circuits that can be split up by a dashed dotted line, i.e., a signal correction signal generation circuit 11A (portion to the left side of the dashed dotted line) and an automatic correction auxiliary circuit 11B (portion to the right side of the dashed dotted line). The signal correction signal generation circuit 11A includes the input terminal T11-11, the input terminal T11-21, the output terminal T11-3, the difference signal generation circuit 12, the variable attenuation circuit 14 and the terminal T813. The automatic correction auxiliary circuit 11B includes the split terminal T821, the split terminal T811, the terminal T813 and the detection signal input terminal T11-4.

The signal correction signal generation circuit 11A generates a signal proportional to ±μta×(e10−e20) and a signal proportional to ±μta×(e20−e10)/2 at the terminal T5-13 and the terminal T5-23 in the immittance conversion generation circuit 5 by outputting a signal, which is obtained by adjusting the attenuation amount in the first variable attenuation circuit 14, from the output terminal T11-3. Thus, the circuit shown in FIG. 1 operates in mirror symmetry even if the signals are small, and can realize bidirectional floating properties.

In this event, the attenuation amount in the variable attenuation circuit 14 may be adjusted as follows.

First, the automatic correction auxiliary circuit 11B minimizes (ideally zero) the absolute value of a difference between the voltage 0.5×(e10+e20), that is half the sum of the voltage e10 generated at the terminal T5-14 and the voltage e20 generated at the terminal 15-24 in the immittance conversion generation circuit 5, and the voltage generated at the point TE in the immittance conversion drive circuit 10. In this state, the voltage generated at the point TE becomes ½ of the sum of the voltage generated at the first terminal 3 and the voltage generated at the second terminal 4 in the circuit shown in FIG. 1. Thus, no current flows to the reference terminal 2 from the point TE in the immittance conversion drive circuit 10. Therefore, the immittance conversion circuit 1 has floating properties.

Next, description is given of operations of the second embodiment using formulae.

When the conditions shown in Formula (3) are not met, i.e., when the absolute value of the total gain μta is small, a correction term a to be added to the right-hand side of Formula (2) is expressed by Formula (7).

[Formula 7]

$$\alpha = + \begin{pmatrix} -\frac{1}{2} & -\frac{1}{2} \\ -\frac{1}{2} & -\frac{1}{2} \end{pmatrix} \begin{pmatrix} e_{10} \\ e_{20} \end{pmatrix} \quad (7)$$

Formula (7) represents the correction term having a dimension of a voltage. A correction voltage thereof takes a value obtained by inverting the sign of ½ of a difference between the voltage e10 at the first terminal 3 and the voltage e20 at the second terminal 4.

The correction term of Formula (7) is added to Formula (2) to obtain Formula (8).

[Formula 8]

$$\begin{pmatrix} i_{10d} \cdot R_{IL1} \\ i_{20d} \cdot R_{IL2} \end{pmatrix} = \begin{pmatrix} \frac{1}{2} \pm \mu_{ta1} & -\frac{1}{2} \mp \mu_{ta1} \\ -\frac{1}{2} \mp \mu_{ta2} & \frac{1}{2} \pm \mu_{ta2} \end{pmatrix} \begin{pmatrix} e_{10} \\ e_{20} \end{pmatrix} \quad (8)$$

Formula (8) means that so-called "bidirectionality" is achieved. More specifically, even if the voltage e10 and the voltage e20 are switched, i.e., the first terminal 3 and the second terminal 4 are switched, the characteristics of the circuit including those shown in FIGS. 1 and 2 are the same.

Using Formula (8), a two-terminal impedance z0 is expressed by Formula (9) where RIL represents the case where RIL1 and RIL2 are the same and μta represents the case where μta1 and μta2 are the same.

[Formula 9]

$$Z_0 = 2 \cdot \frac{R_{IL}}{\frac{1}{2} \pm \mu_{ta}} \quad (9)$$

Here, a negative feedback operation is performed when the sign of the gain μta of the denominator is positive, while a positive feedback operation is performed when the sign thereof is negative. The constant term ½ in the denominator on the right-hand side of Formula (9) has a characteristic different from that of the constant term 1 shown in Formula (1) in a general feedback amplifier circuit.

The signal correction circuit 11 according to the second embodiment achieves an effect of improving the floating properties when the gain μ9 of the conversion target circuit 9 significantly changes (e.g., changes from a value smaller than 1 to a value larger than 1 according to the resonance peak).

Next, the effect achieved by the addition of the signal correction circuit 11 is described based on the results of the numerical simulation. The following description is given of the case where, as to the circuit configuration during the numerical simulation, the impedance conversion generation circuit 5a (FIG. 2) is used as the immittance conversion generation circuit 5 included in the bidirectional floating immittance conversion circuit (FIG. 1) and the origin circuit 9 is a series resonance circuit shown in FIG. 3 in which the coil L and the capacitor C are connected in series. In this case, the bidirectional floating immittance conversion circuit (FIG. 1) functions truly as an LC series resonance impedance conversion circuit.

As various constant set values for the numerical simulation, the values shown in Table 1 (FIG. 17) are used. However, μta is set to 100, which is different from that shown in Table 1. The reason why μta is set to a small value is to highlight the effects of the signal correction circuit 11. Moreover, although description is given, as an example, of only the case where RIL=50Ω, the generality upon explanation of the effects is not lost since qualitative characteristics of the circuit do not change even if the RIL is another value.

The "floating properties" as one of the effects of the present invention are impaired when unnecessary factors are generated in "parallel" between the first terminal 3 and the second terminal 4 for the two-terminal immittance generated between the first terminal 3 and the second terminal 4, and such unnecessary factors adversely affect a desired (correct) two-terminal immittance.

Figure 9:
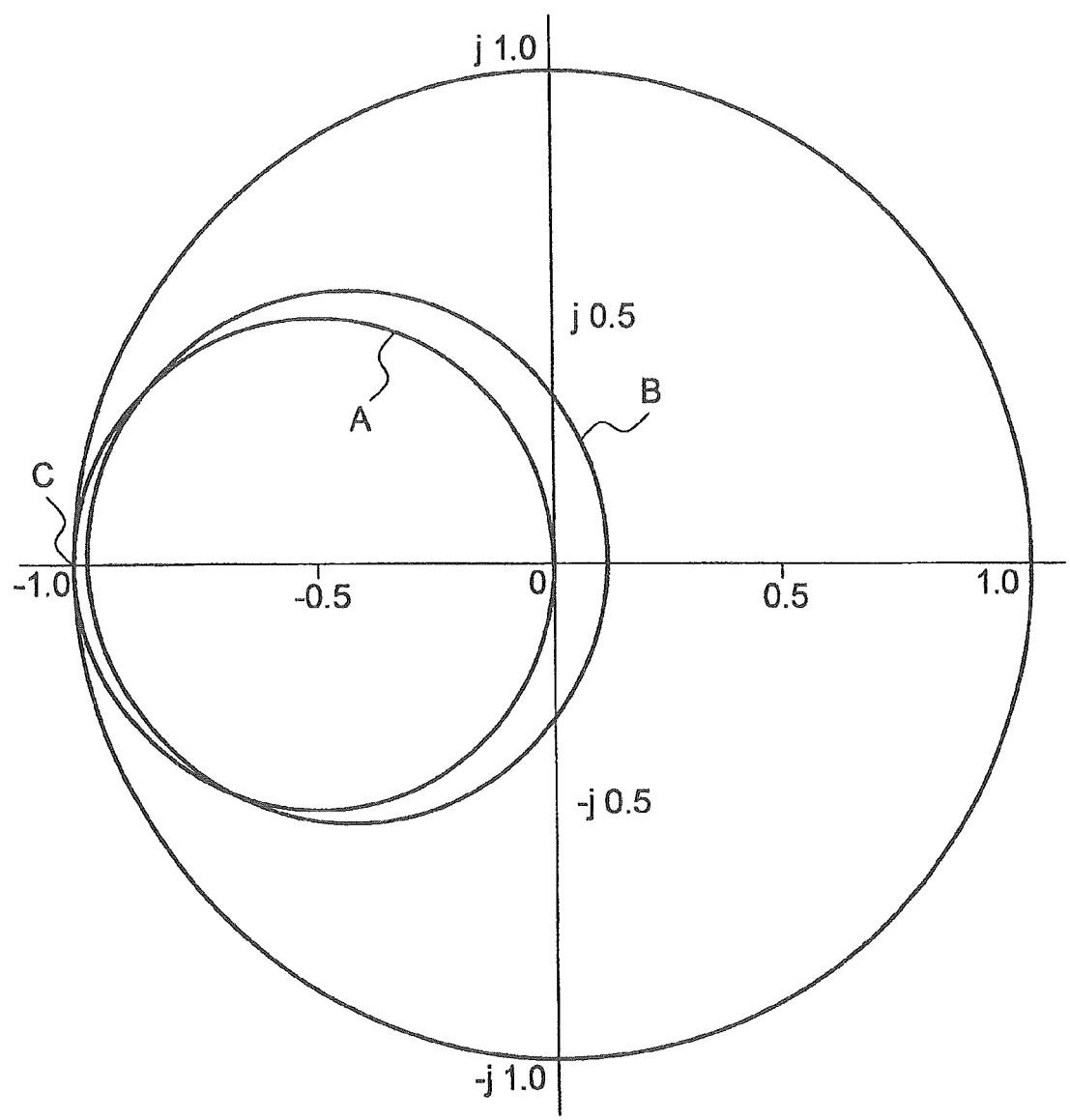
FIG. 9 is a diagram showing effects of an immittance conversion circuit according to the second embodiment.

With reference to FIG. 9, detailed description is given of a difference in effect between the case where the signal correction circuit 11 is provided and the case where no signal correction circuit is provided.

FIG. 9 is a Smith chart, in which the scale represents a reflection coefficient Γ. The horizontal axis is a real axis (−1 to +1), the vertical axis is an imaginary axis (−j to +j), and a circle (unit circle) having a radius of 1 around the origin O corresponds to pure immittance.

FIG. 9 shows the curve A of a circular immittance locus and the curve B of a similar circular immittance locus.

The curve A indicates the simulation result when the correction signal e25 outputted from the signal correction circuit 11 is supplied to the terminal T10-21 in the immittance conversion drive circuit 10.

Upon illustration of the curve A, Curve A is normalized at the resonance frequency thereof by a zn value that passes through the origin O, as characteristic impedance (reference impedance) of the Smith chart. Therefore, the curve A always passes through the origin O.

As a result of the numerical simulation, as to the locus of the two-terminal impedance, the locus with an operating frequency (frequency of the signal es in the peripheral circuit shown in FIG. 4) ω as a parameter is an exact circle, and the circle comes into internal contact with the unit circle at the point C when the operating frequency is ±∞.

On the other hand, the curve B indicates the result of the numerical simulation when the signal correction circuit 11 is not provided and the value of the correction signal e25 from the signal correction circuit 11 is zero, i.e., when the terminal T10-21 in the immittance conversion drive circuit 10 is connected to the reference terminal 2.

Although the curve B has a circular locus as in the case of the curve A, the value of the two-terminal impedance does not truly represent the characteristics of the conversion target circuit 9 in the following two points.

First, the curve B is not in contact with the imaginary axis. In other words, when the frequency is far away from the resonance frequency, the value of the two-terminal impedance is different from a pure imaginary value (reactance value).

Secondly, the curve B does not pass through the origin O, and the intersection point with the horizontal axis is shifted toward a smaller value of equivalent impedance.

The reason for the above two points is because unnecessary factors through the reference terminal 2 are generated in parallel between the first terminal 3 and the second terminal 4. This simulation result indicates that the unnecessary factors are loss components (real components).

The circuit according to this embodiment does not include elements or circuit generating intended reactance, except for the conversion target circuit 9 and a phase shift circuit (compensation circuit) 26.

In actual realization of the circuit according to this embodiment, unintended reactance components (floating capacitance and residual inductance) are generated in those other than the conversion target circuit 9 and the phase shift circuit 26. Such unintended reactance components can be compensated by the phase shift circuit (compensation circuit) 26 included in a loss compensation circuit 20.

Next, also when an admittance conversion generation circuit 5b is used as a conversion circuit to be described later in the fourth embodiment, the locus of two-terminal admittance in the case of supplying the correction signal from the signal correction circuit 11 is circular (normal admittance circle). Meanwhile, when no correction signal is supplied, the floating properties are impaired. Thus, in many cases, such a trajectory curve appears inside the normal admittance circle. Since detailed description of operations and function in such a case is the same as those in the case of the impedance conversion described above, description thereof is omitted.

The above description is given of the fact that the immittance conversion circuit 1 can be realized, having the same two-terminal immittance as that of an actual resonance circuit including a coil and a capacitor, even when μta changes very extensively, taking as an example the case where the resonance circuit including R, L and C shown in FIG. 3 is used as the conversion target circuit 9.

Therefore, although some of the circuits included in the conversion target circuit 9 are shown in Table 2 (FIG. 18), true immittance conversion can be realized in any situation other than the illustrated circuits.

The above functions and effects are described below in terms of utilization. Specifically, without compensation, the value of the two-terminal impedance generated at the first terminal 3 and the second terminal 4 contains unnecessary factors in the characteristics of the conversion target circuit 9. In other words, the conversion operation is not truly realized. This causes a drawback that the value such as insertion loss and guaranteed attenuation amount is different from that of the conversion target circuit 9 at a time of use to a filter.

Embodiment 3

In a third embodiment, description is given of means for reducing unintended resistance components (loss) in the bidirectional floating immittance conversion circuit 1.

For example, in the case of aiming for a high resonance acutance (high Q value) as the total gain μta, unintended loss needs to be reduced. Also, for example, when reactance values are set for the first and second immittance level setting impedance elements RIL1 and RIL2, unintended loss needs to be reduced to realize pure reactance values.

In this case, a change is made also including the constant term ½ in the denominator on the right-hand side of Formula (9). In order to do this, a loss control circuit 21 may be added to the circuit shown in FIG. 1.

Figure 10:
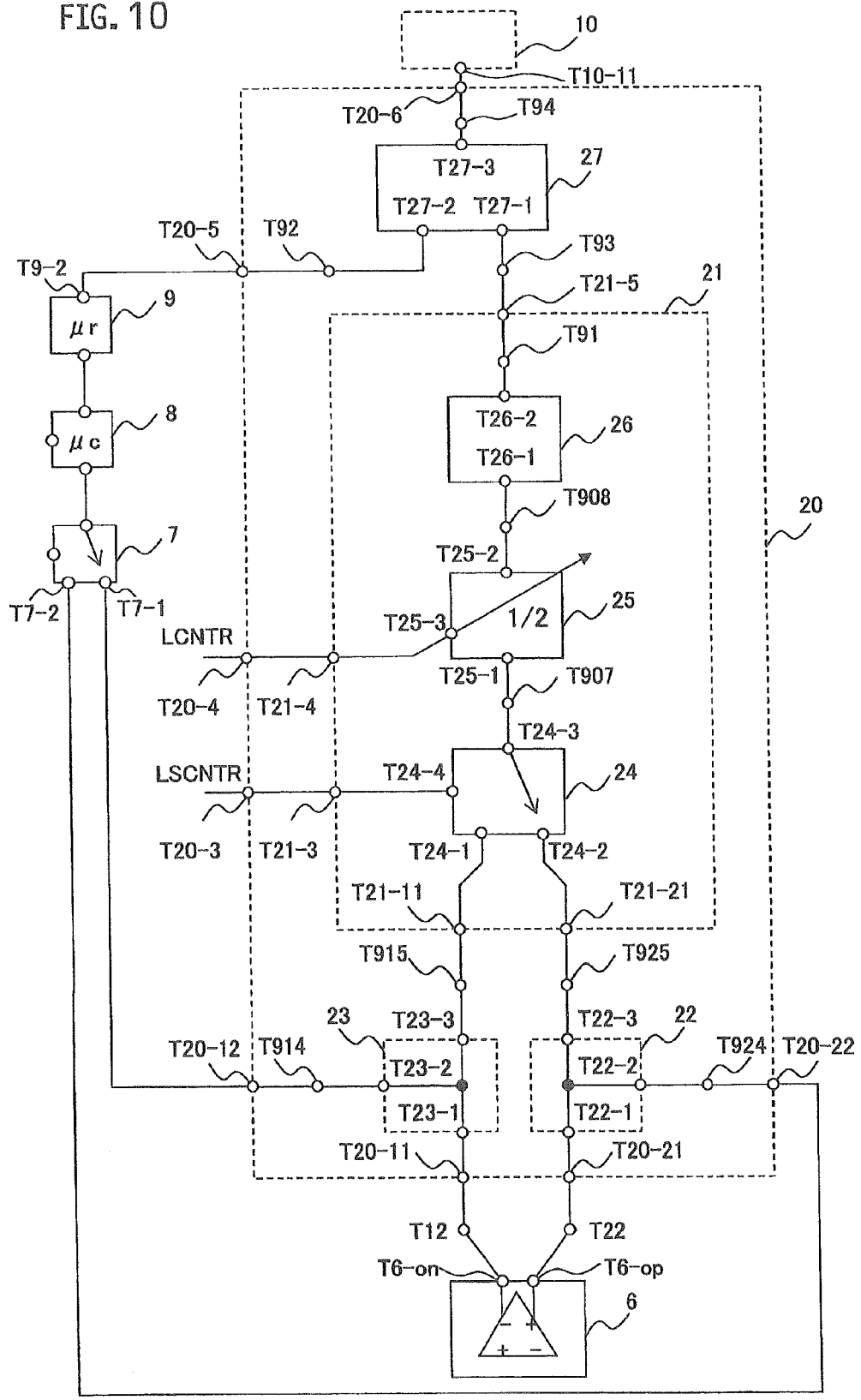
FIG. 10 is a circuit diagram of a loss compensation circuit according to a third embodiment.

A method for adding the loss control circuit 21 is described using the loss compensation circuit 20 shown in FIG. 10. The loss compensation circuit 20 includes terminals T20-11, T20-21, T20-12, T20-22, T20-3, T20-4, T20-5 and T20-6. These eight terminals are connected to the immittance conversion circuit 1 shown in FIG. 1 through the following three steps.

In the first step, the difference signal detection circuit 6 and the signal sign switching circuit 7 are disconnected from each other at the terminals T12 and T22 shown in FIG. 1, and the conversion target circuit 9 and the immittance conversion drive circuit 10 are disconnected from each other at the terminal T15. The signal sign switching circuit 7, the immittance level variable circuit 8 and the conversion target circuit 9 are maintained to be connected to each other.

Next, in the second step, the positive output terminal T6-*op* in the difference signal detection circuit 6 shown in FIG. 1 is connected to the terminal T20-21 in the loss compensation circuit 20 shown in FIG. 10, the negative output terminal T6-*on* in the difference signal detection circuit 6 shown in FIG. 1 is connected to the terminal T20-11 in the loss compensation circuit 20 shown in FIG. 10, and the terminal 120-6 in the loss compensation circuit 20 shown in FIG. 10 is connected to the terminal T10-11 in the immittance conversion drive circuit 10 shown in FIG. 1.

Furthermore, in the third step, the signal sign switching circuit 7, the immittance level variable circuit 8 and the conversion target circuit 9 in the disconnected state are connected to the loss compensation circuit 20. More specifically, the input terminal T7-1 in the signal sign switching circuit 7 is connected to the terminal T20-12 in the loss compensation circuit 20 shown in FIG. 10, the input terminal T7-2 in the signal sign switching circuit 7 is connected to the terminal T20-22 in the loss compensation circuit 20 shown in FIG. 10, and the output terminal T9-2 in the conversion target circuit 9 is connected to the terminal T20-5 in the loss compensation circuit 20 shown in FIG. 10.

Next, with reference to FIG. 10, the loss compensation circuit 20 is described.

The loss compensation circuit 20 includes a signal division circuit 22, a signal division circuit 23, a sign switching circuit 24, a variable amplification/attenuation circuit 25, a phase shift circuit 26 and a signal addition circuit 27.

The signal division circuit 22 divides a signal inputted to an input terminal T22-1 from the terminal T20-21, outputs the divided signal to the terminal T20-22 through a terminal T924 from an output terminal T22-2, and outputs the divided signal to a terminal T925 from an output terminal T22-3.

The signal division circuit 23 divides a signal inputted to an input terminal T23-1 from the terminal T20-11, outputs the divided signal to the terminal T20-12 through a terminal T914 from an output terminal T23-2, and outputs the divided signal to a terminal T915 from an output terminal T23-3.

The sign switching circuit 24 selects one of a signal inputted to an input terminal T24-1 through a terminal T21-11 from the terminal T915 and a signal inputted to an input terminal T24-2 through a terminal T21-21 from the terminal T925, according to a switching control signal LSCNTR inputted to a switching control input terminal T24-4 through a terminal T21-3 from the terminal 20-3, and outputs the selected signal to a terminal T907 from an output terminal T24-3.

Note that simultaneous switching between the sign switching circuit 24 and the signal sign switching circuit 7 enables a signal outputted from the signal addition circuit 27 to be switched to a signal of the sum of the signal through the conversion target circuit 9 and the signal through the loss control circuit 21 or a signal of a difference therebetween. In other words, the sum signal is outputted from the signal addition circuit 27 by switching between the sign switching circuit 24 and the signal sign switching circuit 7 such that the signal through the conversion target circuit 9 and the signal through the loss control circuit 21 have the same phase. On the other hand, the difference signal is outputted from the signal addition circuit 27 by switching between the sign switching circuit 24 and the signal sign switching circuit 7 such that the signal through the conversion target circuit 9 and the signal through the loss control circuit 21 are inverted to have reverse phases.

The variable amplification/attenuation circuit 25 amplifies or attenuates a signal inputted to an input terminal T25-1 from a terminal T907 according to a signal level control signal LCNTR inputted to a signal level control input terminal T25-3 through a terminal T21-4 from the terminal T20-4, and outputs the amplified or attenuated signal to a terminal T908 from an output terminal T25-2.

The phase shift circuit 26 outputs a signal, which is obtained by shifting the phase of a signal inputted to an input terminal T26-1 from the terminal T908, to a terminal T91 from an output terminal T26-2. The phase shift circuit 26 also has a function to compensate for loss of the signal through the conversion target circuit 9 with the signal through the loss compensation circuit 20.

The signal addition circuit 27 outputs a sum signal to the terminal T20-6 through a terminal T94 from an output terminal T27-3, the sum signal obtained by adding up a signal inputted to an input terminal T27-1 through a terminal T21-5 and a terminal T93 from the terminal T91 and a signal inputted to an input terminal T27-2 through a terminal T92 from the terminal T20-5.

Next, description is given of effects of the loss compensation circuit 20. The loss control circuit 21 in the loss compensation circuit 20 uses the phase shift circuit 26 to shift the phase of a signal corresponding to a difference between the signal at the first terminal 3 and the signal at the second terminal 4 shown in FIG. 1, and outputs the signal to the terminal T10-11 or T10-21 in the immittance conversion drive circuit 10. Thus, the real components (loss components) of the immittance conversion circuit 1 can be reduced or increased. Also, if necessary, imaginary components such as floating capacitance, for example, can also be reduced or increased.

As described above, according to the third embodiment of the present invention, the characteristics can be subtracted or added in the dimension of admittance. Particularly, in the case of subtraction, extra characteristics of pr can be compensated for. Thus, a circuit having good characteristics (e.g., high Q) can be provided. For example, parallel capacitance of a resonance element can be reduced to extend a variable range of an oscillation circuit.

Embodiment 4

In the fourth embodiment, description is given of the case where the admittance conversion generation circuit 5*b* is used as the immittance conversion generation circuit 5 included in the bidirectional floating immittance conversion circuit 1 shown in FIG. 1.

The immittance conversion circuit 1 using the admittance conversion generation circuit 5*b* has a characteristic that, as to a relationship between two-terminal immittances to be generated, a qualitative relationship between two-terminal immittances generated by two kinds of immittance conversion generation circuits 5 is a reciprocal relationship, compared with the case where the impedance conversion generation circuit 5*a* is used as the immittance conversion generation circuit 5 described above.

Therefore, when the admittance conversion generation circuit 5*b* shown in FIG. 11 is used as the immittance conversion generation circuit 5 shown in FIG. 1, the bidirectional floating immittance conversion circuit 1 shown in FIG. 1 operates as a bidirectional floating admittance conversion circuit 1.

In the following description, the signs of the terminals in the immittance conversion generation circuit 5 shown in FIG. 1 correspond to the signs of the terminals in the admittance conversion generation circuit 5*b* shown in FIG. 11.

The admittance conversion generation circuit 5*b* includes the terminal T5-11, the terminal T5-12, the terminal T5-13 (also called a first feedback signal input terminal), the terminal T5-14, the terminal T5-21, the terminal T5-22, the terminal T5-23 (also called a second feedback signal input terminal), and the terminal T5-24.

In the admittance conversion generation circuit 5b, the terminal T5-11 is connected to a base of a transistor Q11 through a connection point T110 and a terminal T111. A collector of the transistor Q11 is connected to one of terminals of an immittance level setting impedance element RIL11 through a connection point T112 and further to the terminal T5-12 through a terminal T113. The other terminal of the immittance level setting impedance element RIL11 is connected to a DC potential V11.

The terminal T5-13 is connected to a base of a transistor Q12 through a terminal T115, and a collector of the transistor Q12 is connected to one of terminals of an immittance level setting impedance element RIL12. An emitter of the transistor Q11, an emitter of the transistor Q12 and one of terminals of a common impedance RE (also called a common resistor RE) are connected to each other at a connection point T116. The other terminal of the immittance level setting impedance element RIL12 is connected to a DC potential V12.

The terminal T5-21 is connected to a base of a transistor Q13 through a connection point T120 and a terminal T121. A collector of the transistor Q13 is connected to one of terminals of an immittance level setting impedance element RIL21 through a connection point T122 and further to the terminal T5-22 through a terminal T123. The other terminal of the immittance level setting impedance element RIL21 is connected to a DC potential V21.

The terminal T5-23 is connected to a base of a transistor Q14 through a terminal T125, and a collector of the transistor Q14 is connected to one of terminals of an immittance level setting impedance element RIL22. An emitter of the transistor Q13, an emitter of the transistor Q14 and the other terminal of the common impedance RE are connected to each other at a connection point T126. The other terminal of the immittance level setting impedance element RIL22 is connected to a DC potential V22.

The terminal T5-14 is connected to the connection point T110. The terminal T5-24 is connected to the connection point T120.

Next, in terms of "floating properties", description is given of operations of the circuit described above, taking the admittance conversion generation circuit 5b shown in FIG. 11 as an example. For the purpose of illustration, it is assumed that the circuit configuration and setting of circuit constants shown in FIG. 11 are in mirror symmetry in the vertical and horizontal directions of FIG. 11. Even in such a case, the generality of the present invention is not lost. However, the left and right transistors are in complementary mirror symmetry in terms of DC, but may be treated as having horizontal mirror symmetry in terms of AC signal. Also, the signal e10 is inputted to the terminal T5-11, while the signal e20 is inputted to the terminal T5-21.

Here, when the signal e19 inputted to the terminal T5-13 is equal to the signal e20 and the signal e29 inputted to the terminal T5-23 is equal to the signal e10, an in-phase signal component $e1113c$ between the signal inputted to the terminal T5-11 and the signal inputted to the terminal T5-13 and an in-phase signal component $e2123c$ between the signal inputted to the terminal T5-21 and the signal inputted to the terminal 15-23 have the same potential, which coincides with the potential at a virtual intermediate point of the common resistor RE between the terminal T116 and the terminal T126. Thus, no current flows through the common resistor RE. Moreover, a current having a differential signal component $e1113d$ ($=(e10-e20)\times0.5$) of the signals inputted to the terminal T5-11 and the terminal T13 flows through a current path from the terminal T116, through the transistor Q11, the immittance level setting impedance element RIL11, the DC power supply V11, the DC power supply V12, the immittance level setting impedance RIL12 and the transistor Q12, back to the terminal T116. In other words, no current flows through the common resistor RE and any portion through the DC power supplies V11 and V12. Since the same goes for a current path including the transistors Q13 and Q14, description thereof is omitted.

A condition setting $((e10+e20)\times0.5=(e19+e29)\times0.5)$ that allows an in-phase signal component $e1121c$ between the signal inputted to the terminal T5-11 and the signal inputted to the terminal T5-21 to coincide with an in-phase signal component $e1323c$ between the signal inputted to the terminal T5-13 and the signal inputted to the terminal T5-23 is an in-phase signal balance condition. This condition can be realized by the signal correction circuit 11 described in the second embodiment.

Next, description is given of the case where the magnitude of the signal inputted to the terminal T5-13 and the magnitude of the signal inputted to the terminal T5-23 have arbitrary values, in a state where the in-phase signal balance condition described above is met.

An in-phase signal component $e1019c$ ($=(e10+e19)\times0.5$) between the signal e10 inputted to the base of the transistor Q11 and the signal e19 inputted to the base of the transistor Q12 does not coincide with the potential ($(e10+e20)\times0.5$) at the virtual intermediate point of the common resistor RE. Therefore, a current $i1019c$ flows through the common resistor RE due to the in-phase signal component $e1019c$.

An in-phase signal component $e2029c$ ($=(e20+e29)\times0.5$) between the signal e20 inputted to the base of the transistor Q13 and the signal e29 inputted to the base of the transistor Q14 does not coincide with the potential ($(e10+e20)\times0.5$) at the virtual intermediate point of the common resistor RE. Therefore, a current $i2029c$ flows through the common resistor RE due to the in-phase signal component $e2029c$.

If the signal e10 inputted to the terminal T5-11, the signal e20 inputted to the terminal T5-21, the signal e19 inputted to the terminal T5-13, and the signal e29 inputted to the terminal T5-23 satisfy the in-phase signal balance condition and the differential signal balance condition, the magnitudes of the two currents $i1019c$ and $i2029c$ coincide. Here, the in-phase signal balance condition is $(e10+e20)\times0.5=(e19+e29)\times0.5$. Also, the differential balance condition is that a signal which is proportional to the absolute value $|e10-e20|$ and has an opposite sign is supplied to the both ends of the common resistor RE. More specifically, the two currents $i1019c$ and $i2029c$ coincide when a signal that meets the differential signal balance condition is inputted to the terminals T5-13 and T5-23.

Note that all AC currents flowing from the common resistor RE to the DC power supplies V11 and V12 through the transistors Q11 and Q12 flow into the DC power supplies V21 and V22 and reach the common resistor RE through the terminal T126 after flowing through the transistors Q13 and Q14. More specifically, even when the DC power supplies V11, V12, V21 and V22 are connected to the reference terminal 2 (e.g., ground) in the AC manner, no current flows through the reference terminal 2. Therefore, the flowing properties are satisfied.

A circuit to supply a signal, which simultaneously meets such in-phase signal balance condition and differential signal balance condition, to the terminals T5-13 and T5-23 is the immittance conversion drive circuit 10, which manages the potential at the point TE shown in FIG. 1 or FIG. 8 to be $(e10+e20)\times0.5$.

The differential signal inputted from the terminal T5-11 flows to the DC power supply V11 through the transistor Q11 and the immittance level setting impedance element RIL11. Meanwhile, the differential signal inputted from the terminal T5-13 flows to the DC power supply V11 through the transistor Q12 and the immittance level setting impedance element RIL12. Also, the emitter of the transistor Q11 is connected to the emitter of the transistor Q12. Thus, if the characteristics of the transistor Q11 are the same as those of the transistor Q12, a current flowing between the base and collector of the transistor Q11 and a current flowing between the base and collector of the transistor Q12 have signs opposite to each other and the same absolute value.

Likewise, if the characteristics of the transistor Q13 are the same as those of the transistor Q14, a current flowing between the base and collector of the transistor Q13 and a current flowing between the base and collector of the transistor Q14 have signs opposite to each other and the same absolute value.

The transistors Q11 and Q12 on the left side and the transistors Q13 and Q14 on the right side operate in the same manner, respectively. Thus, in the admittance conversion generation circuit 5b, a current having an in-phase component flows through the common impedance RE in a steady state.

Next, description is given of effects of the fourth embodiment. When the equivalent circuit in the conversion target circuit 9 shown in FIG. 3 corresponds to the series circuit, a two-terminal immittance (parallel resonance circuit) can be realized in the fourth embodiment.

In the section of the fourth embodiment in Table 2 (FIG. 18), an example for realizing the two-terminal impedance z0 is described.

Next, with reference to FIG. 11, description is given of operations of the fourth embodiment. The admittance conversion generation circuit 5b as the immittance conversion generation circuit 5 shown in FIG. 1 constitutes a part of a series addition feedback circuit in the immittance conversion circuit 1 as a whole. More specifically, in FIG. 11, the admittance conversion generation circuit 5b operates such that the signal inputted to the terminal T5-11 and the signal inputted to the terminal T5-13 are added or subtracted as voltages at the connection point T116 on the left side of the common impedance RE. Likewise, the admittance conversion generation circuit 5b operates such that the signal applied to the terminal 15-21 and the signal inputted to the terminal T5-23 are added or subtracted as voltages at the connection point T126 on the right side of the common impedance RE. This is equivalent to the fact that, for example, the currents flowing through the immittance level setting impedance elements RIL11 and RIL12 are proportional to a different between or the sum of the voltages inputted to the terminals T5-11 and T5-13.

Therefore, in the fourth embodiment, the signal (e10) inputted to the terminal T5-11 and the signal (e19) inputted to the terminal T5-13 are added or subtracted as voltages. Likewise, the signal (e20) inputted to the terminal T5-21 and the signal (e29) inputted to the terminal 15-23 are added or subtracted as voltages. Thus, the immittance conversion generation circuit 5 operates as the admittance conversion generation circuit. This is essentially different from the fact that currents inputted to the terminals T5-11 and T5-13 are directly inputted, i.e., added or subtracted as currents, as to the current flowing through the immittance level setting impedance element RIL1, for example, in the impedance conversion generation circuit 5a shown in FIG. 2 in the first embodiment.

Figure 12:
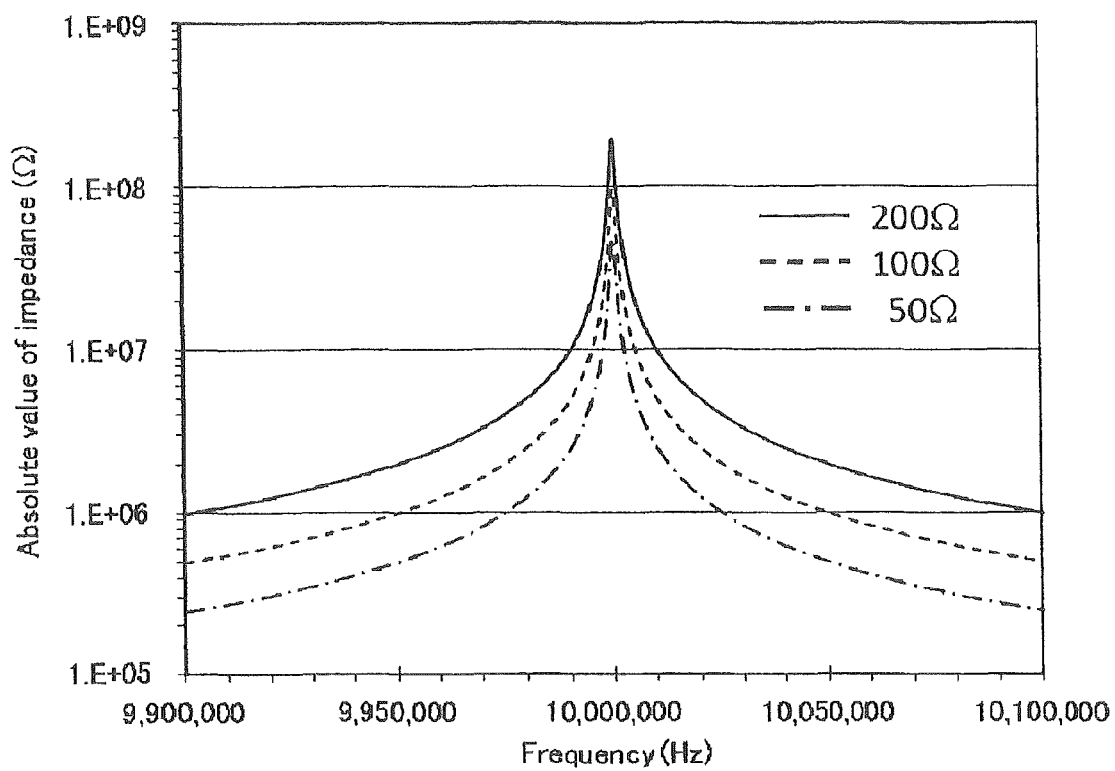
FIG. 12 is a diagram showing an example of simulation results on an immittance conversion circuit according to the fourth embodiment.

Next, with reference to FIG. 12, simulation results are described. As simulation conditions, a current amplification factor of the four transistors is 99 and the common impedance RE is 8 kΩ. Other parameters are as shown in Table 1.

The horizontal and vertical axes in FIG. 12 are the same as those shown in FIG. 5(a). FIG. 12 shows that the impedance generated between the first and second terminals 3 and 4 is proportional to the resistance values of the resistors RIL11 to RIL22 connected between the collectors of the four transistors and the DC power supply, and proportional to the total gain including the gain of the conversion target circuit.

The resistors RIL11 to RIL22 may have their values varying according to a control signal inputted from outside. In this event, the resistors RIL11 to RIL22 may be controlled to have the same value, or may be controlled such that the values thereof are in a predetermined relationship.

Next, using formulae, description is given of operations of the bidirectional floating immittance conversion circuit 1 using the admittance conversion generation circuit 5b.

The two-terminal impedance z0 between the first and second terminals 3 and 4 in the bidirectional floating immittance conversion circuit 1 can be represented by Formula (10).

[Formula 10]

$$Z_0 = 2\beta R_{IL}\left(\frac{1}{2} \pm \mu_{ta}\right) \quad (10)$$

In Formula (10), RIL11, RIL12, RIL21 and RIL22 shown in FIG. 11 are resistors disposed between the collector terminals of the four transistors Q11, Q12, Q13 and Q14 and the DC power supply. The resistance values thereof are all equally set to RIL.

β is a current amplification factor for the four transistors Q11, Q12, Q13 and Q14, which is also set to the same value for all the transistors.

Generally, the following Formula (11) and Formula (12) may be true in order for Formula (10) to be true.

[Formula 11]

$$R_{IL1}j = R_{IL2}j (j=1,2) \quad (11)$$

[Formula 12]

$$\pm\mu_{ta1}\cdot R_{IL1}j = \pm\mu_{ta2}\cdot R_{IL2}j (j=1,2) \quad (12)$$

μta is the total gain from the terminal T5-12 to the terminal T5-13 and the total gain from the terminal T5-22 to the terminal T5-23, both of which are set the same. Also, the value of μta is generally a complex quantity. Moreover, the sign of μta varies depending on whether the operation is a negative feedback operation or a positive feedback operation.

Next, description is given of positive feedback connection and negative feedback connection when using the admittance conversion generation circuit 5b shown in FIG. 11.

It is determined whether or not a phase relationship between the terminal T5-11 and the terminal T5-13, for example, is the positive feedback connection or negative feedback connection.

The fourth embodiment has an effect of providing a circuit in a qualitatively reciprocal relationship with the first embodiment. More specifically, as shown in Formula (6) and Formula (10), since the complex component (μta) has a reciprocal relationship, the frequency characteristics shown in FIG. 5(a) are opposite to those shown in FIG. 12.

Next, description is given of a circuit example in which the amplification effect is not essential (i.e., |μta|<1) in the immittance conversion drive circuit 10 and the admittance conversion generation circuit 5b according to the present invention. As to the connection between the peripheral portion and bases (gates), emitters (sources) and collectors (drains) of transistors included in the immittance conversion drive circuit 10 and the admittance conversion generation circuit 5b, the bases (gates), emitters (sources) and collectors (drains) can be arbitrarily selected as long as the first terminal 3 side and the second terminal 4 side are connected in mirror symmetry.

Figure 13:
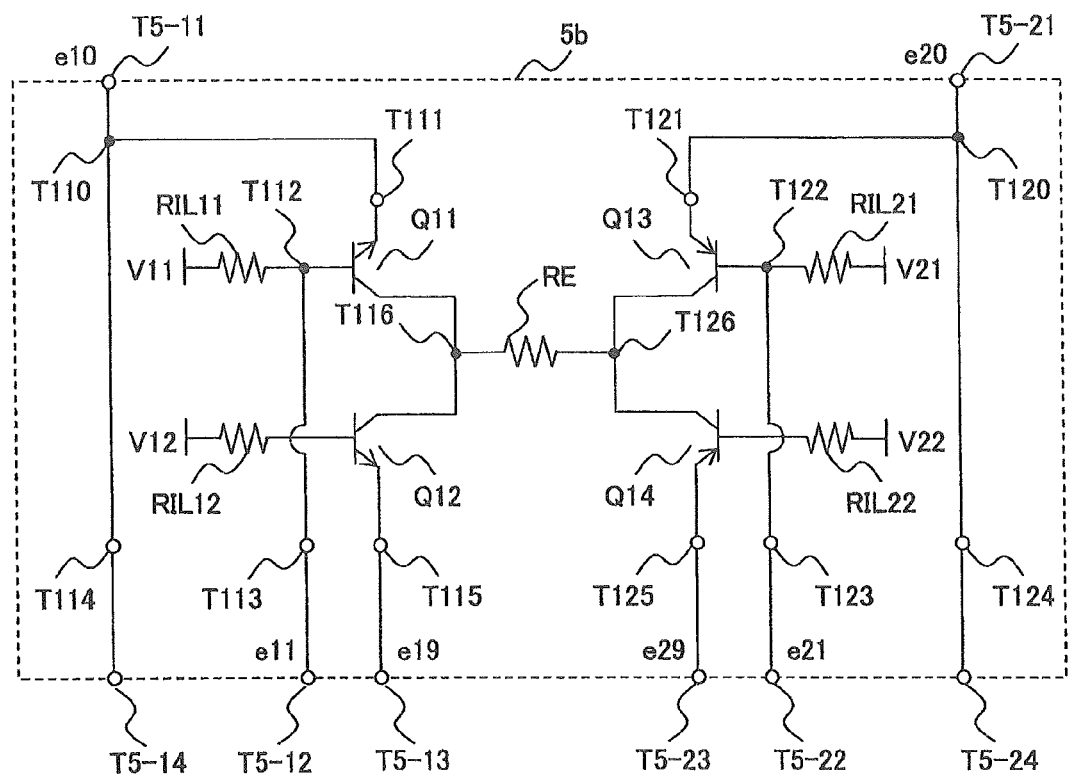
FIG. 13 is a circuit diagram showing a modified example of the admittance conversion generation circuit according to the fourth embodiment, which is used as the immittance conversion drive circuit shown in FIG. 1.

Next, with reference to FIG. 13, description is given of a circuit form that has current durability, as the admittance conversion generation circuit 5b. The admittance conversion generation circuit 5b in this modified example has a circuit form in which the bases (gates) of the respective transistors are not connected to the terminals T5-11, T5-13, T5-21 and T5-23.

In the admittance conversion generation circuit 5b shown in FIG. 13, the terminal T5-11 is connected to the emitter of the transistor Q11 through the connection point T110 and the terminal T111. The base of the transistor Q11 is connected to one of the terminals of the immittance level setting impedance element RIL11 through the connection point T112, and further to the terminal T5-12 through the terminal T113. The other terminal of the immittance level setting impedance element RIL11 is connected to the DC potential V11.

The terminal T5-13 is connected to the emitter of the transistor Q12 through the terminal T115, and the base of the transistor Q12 is connected to one of the terminals of the immittance level setting impedance element RIL12. The collector of the transistor Q11, the collector of the transistor Q12 and one of the terminals of the common impedance RE are connected to each other at the connection point T116. The other terminal of the immittance level setting impedance element RIL12 is connected to the DC potential V12.

The terminal T5-21 is connected to the emitter of the transistor Q13 through the connection point T120 and the terminal T121. The base of the transistor Q13 is connected to one of the terminals of the immittance level setting impedance element RIL21 through the connection point T122, and further to the terminal T5-22 through the terminal T123. The other terminal of the immittance level setting impedance element RIL21 is connected to the DC potential V21.

The terminal T5-23 is connected to the emitter of the transistor Q14 through the terminal T125, and the base of the transistor Q14 is connected to one of the terminals of the immittance level setting impedance element RIL22. The collector of the transistor Q13, the collector of the transistor Q14 and the other terminal of the common impedance RE are connected to each other at the connection point T126. The other terminal of the immittance level setting impedance element RIL22 is connected to the DC potential V22.

The terminal T5-14 is connected to the connection point T110. The terminal T5-24 is connected to the connection point T120.

Since the operations and effects of the modified example shown in FIG. 13 are the same as those of the admittance conversion generation circuit 5b shown in FIG. 11, description thereof is omitted.

Figure 14:
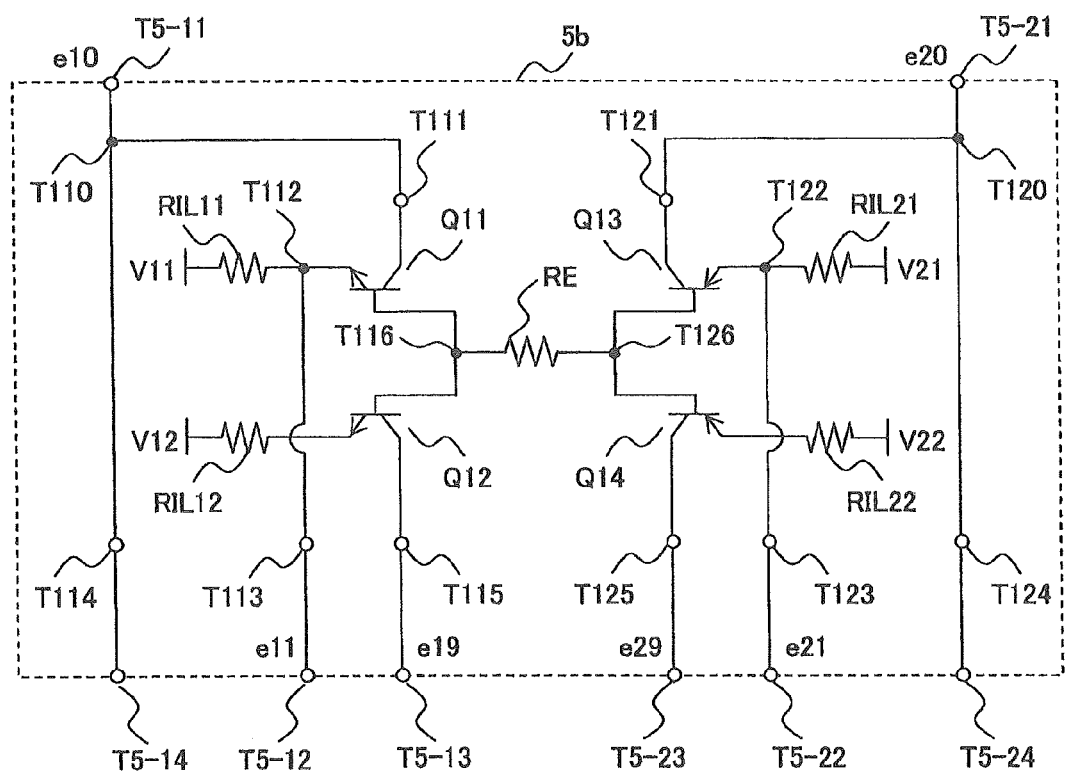
FIG. 14 is a circuit diagram showing a modified example of the admittance conversion generation circuit according to the fourth embodiment, which is used as the immittance conversion drive circuit shown in FIG. 1.

Next, with reference to FIG. 14, description is given of a second modified example of the admittance conversion generation circuit 5b.

In the admittance conversion generation circuit 5b shown in FIG. 14, the terminal T5-11 is connected to the collector of the transistor Q11 through the connection point T110 and the terminal T111. The emitter of the transistor Q11 is connected to one of the terminals of the immittance level setting impedance element RIL11 through the connection point T112, and further to the terminal T5-12 through the terminal T113. The other terminal of the immittance level setting impedance element RIL11 is connected to the DC potential V11.

The terminal T5-13 is connected to the collector of the transistor Q12 through the terminal T115, and the emitter of the transistor Q12 is connected to one of the terminals of the immittance level setting impedance element RIL12. The base of the transistor Q11, the base of the transistor Q12 and one of the terminals of the common impedance RE are connected to each other at the connection point T116. The other terminal of the immittance level setting impedance element RIL12 is connected to the DC potential V12.

The terminal T5-21 is connected to the collector of the transistor Q13 through the connection point T120 and the terminal T121. The emitter of the transistor Q13 is connected to one of the terminals of the immittance level setting impedance element RIL21 through the connection point T122, and further to the terminal T5-22 through the terminal T123. The other terminal of the immittance level setting impedance element RIL21 is connected to the DC potential V21.

The terminal T5-23 is connected to the collector of the transistor Q14 through the terminal T125, and the emitter of the transistor Q14 is connected to one of the terminals of the immittance level setting impedance element RIL22. The base of the transistor Q13, the base of the transistor Q14 and the other terminal of the common impedance RE are connected to each other at the connection point T126. The other terminal of the immittance level setting impedance element RIL22 is connected to the DC potential V22.

The terminal T5-14 is connected to the connection point T110. The terminal T5-24 is connected to the connection point T120.

Since the operations and effects of the modified example shown in FIG. 14 are the same as those of the admittance conversion generation circuit 5b shown in FIG. 11, description thereof is omitted.

In the examples shown in FIGS. 13 and 14, since the current flowing from the terminal 15-11 to the transistor Q11 and the current flowing to the transistor Q12, for example, do not flow through the base terminal of each of the transistors, there is room for a sufficient current to flow. More specifically, the admittance conversion generation circuit 5b shown in FIGS. 13 and 14 can handle a large current even though the voltage amplification factor is small.

The above description is given of the case of base input-emitter common form with reference to FIG. 11, the case of emitter input-collector common form with reference to FIG. 13, and the case of collector input-base common form with reference to FIG. 14. Besides the three examples described above, FETs may be used as the transistors. More specifically, the source terminal may be grounded instead of emitter grounding, the gate terminal may be grounded instead of base grounding, and the drain terminal may be grounded instead of collector grounding.

Note that the same DC bias circuit or the like as that of the conventional technology needs to be added to the admittance conversion generation circuit 5b shown in FIGS. 11, 13 and 14, for operations thereof. Furthermore, as shown in FIGS. 11, 13 and 14, in the case of bipolar transistors, it is the same as the conventional technology that complementary transistors are adopted as Q11 and Q13 and complementary transistors are adopted as Q12 and Q14.

Next, description is given of another modified example of the bidirectional floating immittance conversion circuit 1.

In the present specification, the "floating properties" are used as the concept including "separation" between a performance generation terminal and a performance control terminal, in addition to so-called "floating properties". Such separation is dependent on isolation between the bases and collectors of the transistors Q1 and Q2 shown in FIG. 1, for example. In order to extend such isolation, the transistors may be cascode-connected. Meanwhile, in order to extend isolation between the base and emitter, the transistors may be Darlington-connected.

The conversion target circuit 9 may be any circuit, such as a unidirectional three-terminal circuit, a bidirectional three-terminal circuit and a two-terminal circuit. Moreover, the conversion target circuit 9 does not have to have an amplification effect.

In the second embodiment, the description is given of the example where the attenuation amount of the variable attenuation circuit 14 shown in FIG. 8 is adjusted to satisfy the floating properties. However, the present invention is not limited thereto. Specifically, more extensive characteristics of the two-terminal immittance, i.e., behavior on the complex plane can be controlled more extensively, such as from a simple circular shape to a cardioid shape, by eliminating the restriction on the floating performance.

Embodiment 5

In the first to fourth embodiments, the description is given of the fact that the bidirectional floating immittance conversion circuit 1 using the conversion target circuit 9 shown in FIG. 3 has the following characteristics. When the impedance conversion generation circuit 5a shown in FIG. 2 is used as the immittance conversion generation circuit 5, the immittance conversion circuit 1 has impedance characteristics equivalent to those of the series resonance circuit. Meanwhile, when using the admittance conversion generation circuit 5b shown in FIG. 11, the immittance conversion circuit 1 has impedance characteristics equivalent to those of the parallel resonance circuit.

Furthermore, the description is given of the fact that the resonance frequencies of the two equivalent resonance circuits can be controlled by the frequency control signal FCNTR, the impedance level can be controlled by the immittance level control signal ICNTR, and the both can be independently controlled.

Figure 15:
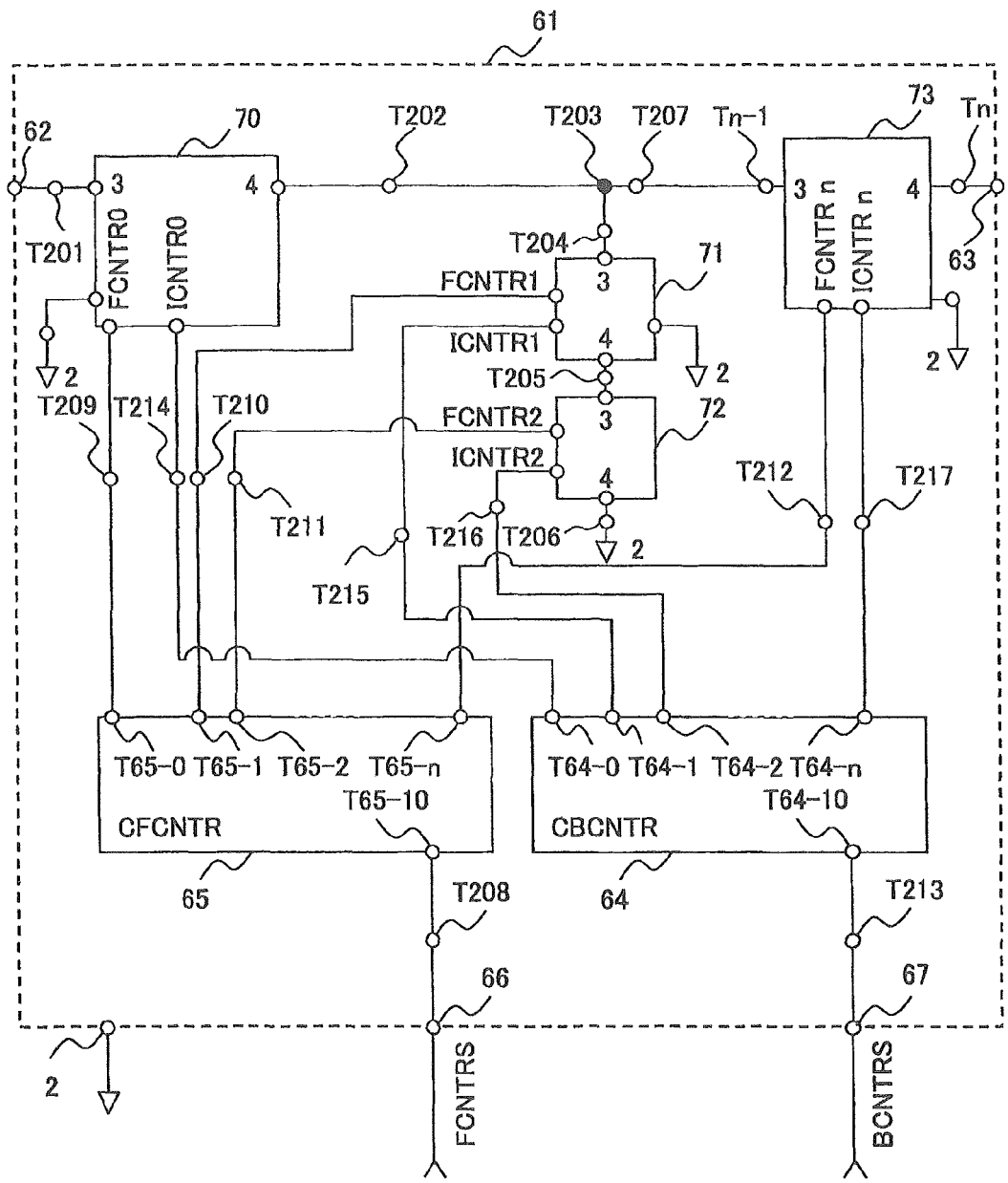
FIG. 15 is a diagram showing an example of a tunable filter circuit according to a fifth embodiment.

In the fifth embodiment, with reference to FIG. 15, description is given of means for changing the center frequency and passband width according to an external control signal, taking a symmetrical polar bandpass filter having one ends of input and output ports as reference terminals as an example of a filter using such series resonance circuit and parallel resonance circuit.

In a tunable filter 61 shown in FIG. 15, only four bidirectional floating immittance conversion circuits 70, 71, 72 and 73 are shown. The bidirectional floating immittance conversion circuit 1 according to the embodiments described above is used as the bidirectional floating immittance conversion circuits 70 to 73. Moreover, terminals 3 and 4 of the immittance conversion circuit 70 and the like in the tunable filter 61 correspond to the terminals 3 and 4 of the bidirectional floating immittance conversion circuit 1, respectively. In the following description, for example, the bidirectional floating immittance conversion circuit 70 is simply called a "resonance circuit 70". The same goes for the other immittance conversion circuits.

Since the tunable filter 61 is a symmetrical polar bandpass filter, the resonance circuits 70 and 73 are series resonance circuits, one of the resonance circuits 71 and 72 is a series resonance circuit, and the other one of the resonance circuits 71 and 72 is a parallel resonance circuit. More specifically, the impedance conversion generation circuit 5a is used for one of the resonance circuits 71 and 72, while the admittance conversion generation circuit 5b is used for the other one of the resonance circuits 71 and 72.

The tunable filter 61 shown in FIG. 15 includes an input terminal 62, an output terminal 63, a reference terminal 2, a center frequency control signal input terminal 66 and a bandwidth control signal input terminal 67.

The tunable filter 61 shown in FIG. 15 includes the resonance circuits 70, 71, 72 and 73, a bandwidth control circuit 64 and a center frequency control circuit 65.

The resonance circuit 70 outputs a signal, which is obtained by performing a resonance operation on a signal supplied to the terminal 3 from the input terminal 62 through a terminal T201, to a terminal T202 from the terminal 4.

The resonance circuit 71 outputs a signal, which is obtained by performing a resonance operation on a signal inputted to the terminal 3 from the terminal T202 through a connection point T203 and a terminal T204, to a terminal T205 from the terminal 4.

The resonance circuit 72 outputs a signal, which is obtained by performing a resonance operation on a signal inputted to the terminal 3 through the terminal T205, to a terminal T206 from the terminal 4.

The resonance circuit 73 outputs signals, which are obtained by performing a resonance operation on signals inputted to a terminal T207 from the connection point T203 and to the terminal 3 from a terminal Tn−1, to a terminal Tn from the terminal 4.

The bandwidth control circuit 64 outputs a signal, which is obtained by converting a signal BCNTRS supplied to an input terminal T64-10 from the bandwidth control signal input terminal 67 through a terminal T213 by using a predetermined conversion function, to each of output terminals T64-0, T64-1, T64-2 and T64-n. More specifically, output signals from the bandwidth control circuit 64 are inputted, respectively, to an immittance control input terminal ICNTR0 in the resonance circuit 70 from the output terminal T64-0 through a terminal T214, to an immittance control input terminal ICNTR1 in the resonance circuit 71 from the output terminal T64-1 through a terminal T215, to an immittance control input terminal ICNTR2 in the resonance circuit 72 from the output terminal T64-2 through a terminal T216, and to an immittance control input terminal ICNTRn in the resonance circuit 73 from the output terminal T64-n through a terminal T217.

The center frequency control circuit 65 outputs a signal, which is obtained by converting a signal FCNTRS inputted to an input terminal T65-10 from the center frequency control signal input terminal 66 through a terminal T208 by using a predetermined conversion function, to each of output terminals T65-0, T65-1, T65-2 and T65-n. More specifically, output signals from the center frequency control circuit 65 are inputted, respectively, to a frequency control input terminal FCNTR0 in the resonance circuit 70 from the output terminal T65-0 through a terminal T209, to a frequency control input terminal FCNTR1 in the resonance circuit 71 from the output terminal T65-1 through a terminal T210, to a frequency control input terminal FCNTR2 in the resonance circuit 72 from the output terminal T65-2 through a terminal T211, and to a frequency control input terminal FCNTRn in the resonance circuit 73 from the output terminal T65-n through a terminal T212.

The terminal T206 is connected to the reference terminal 2, while the terminal Tn is connected to the output terminal 63.

Operations of the tunable filter 61 are described. The tunable filter 61 shown in FIG. 15 can independently change the passband width and the center frequency, using BCNTRS and FCNTRS, with respect to the given input/output impedance.

The passband width can be controlled by changing the immittance level control signals ICNTR, in a reciprocal relationship with each other, in the immittance level tunable circuit 8 in the bidirectional floating immittance conversion circuit 1 included in each of the resonance circuits. The reciprocal relationship among the immittance level control signals ICNTR inputted to the four resonance circuits 70 to 73 can be arbitrarily set by controlling the values, which are converted using the conversion functions pre-stored in the bandwidth control circuit 64, in association with the respective immittance level control signals ICNTR according to the bandwidth control signal BCNTR. This control function can also follow, when bandwidth and impedance of a peripheral circuit are changed dynamically.

The center frequency can be controlled by changing the value converted using a conversion function pre-stored in the center frequency control circuit 65, simultaneously with the frequency control signal FCNTR according to the center frequency control signal FCNTRS. Such a control state can also follow dynamic matching, i.e., when the bandwidth and impedance of the peripheral circuit are changed. In the tunable filter 61 according to the fifth embodiment, the resonance frequencies of the respective resonance circuits 70 to 73 can be all set to the same frequency by appropriately setting a reciprocal relationship among the ICNTR signals of the resonance circuits. Thus, highly accurate simultaneous control of the resonance frequencies can be easily realized using an automatically tuned circuit and the like.

Next, with reference to FIG. 19 (Table 3), description is given of a configuration of a tunable filter circuit including a combination of the resonance circuits according to the fifth embodiment.

Table 3 (FIG. 19) shows configurations of the resonance circuits 70 to 73 for four kinds of filters, a band pass filter, a band elimination filter, a low pass filter and a high pass filter. Table 3 also shows the configurations of the resonance circuits 70 and 71 for two kinds of filters, an advance phase shifter and a delay phase shifter, besides the filters described above.

In order to form a bandpass filter, for example, the resonance circuit 70 is D (series resonance circuit) of Embodiment 1 or E (series resonance circuit) of Embodiment 4 in FIG. 18 (Table 2). The resonance circuit 71 is D (parallel resonance circuit) of Embodiment 4 or E (parallel resonance circuit) of Embodiment 1 in Table 2. The resonance circuits 72 and 73 are D (series resonance circuit) of Embodiment 1 or E (series resonance circuit) of Embodiment 4 in Table 2. A Chebyshev bandpass filter can be formed by forming the resonance circuits 70 to 73 as described above.

However, the sign of the sign switching control signal SCNTR in the signal sign switching circuit 7 in the resonance circuit included in the filter shown in Table 3 (FIG. 19) can be arbitrarily selected between positive and negative. Particularly, in the case of the advance phase shifter and the delay phase shifter, even one shifter has an effect of switching and inverting the both phases, the advance phase and the delay phase, by inverting the sign of SCNTR between positive and negative.

Moreover, filters having other forms can also obtain the configuration of each resonance circuit by referring to Table 2 with the sign described in Table 3.

<Simulation>

Figure 16:
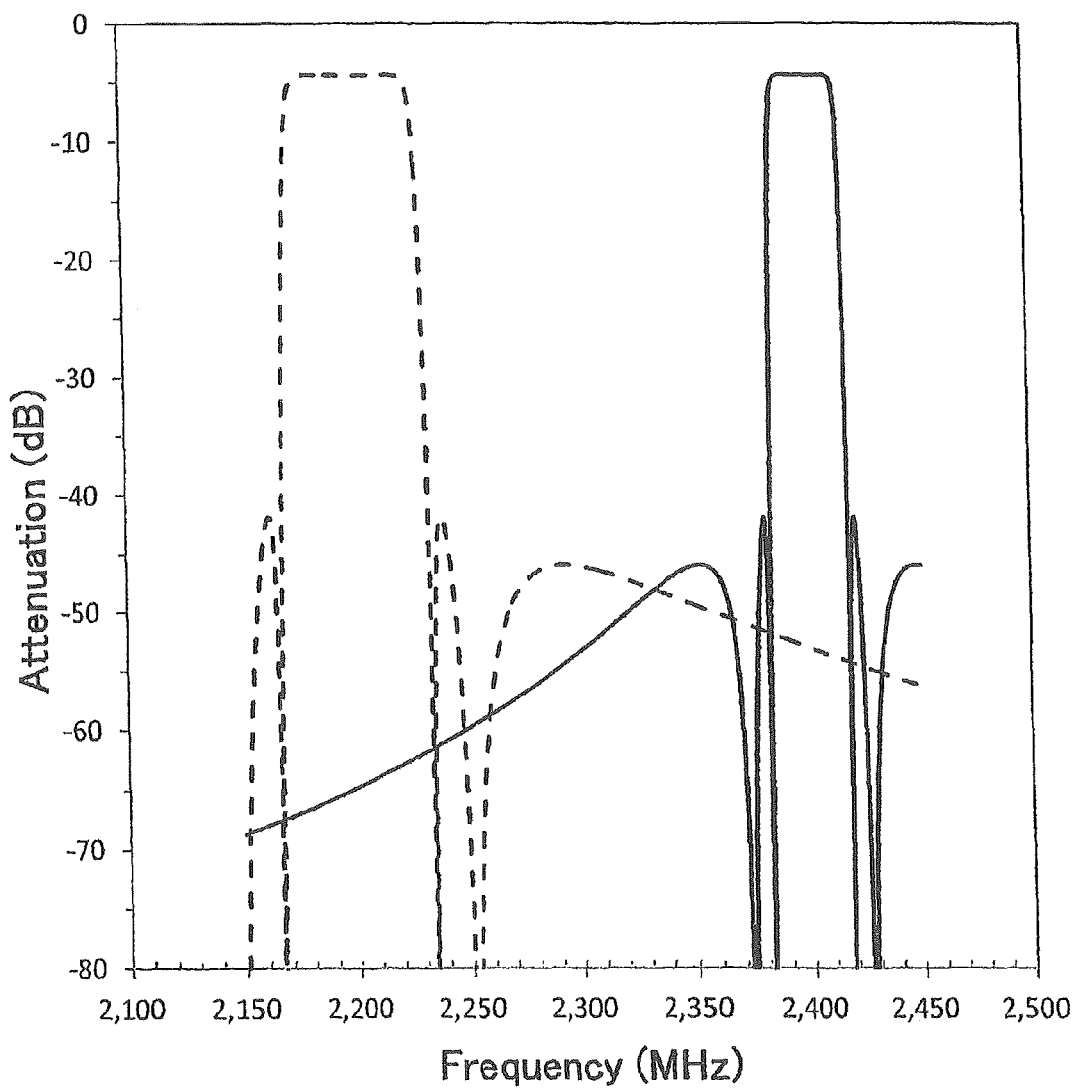
FIG. 16 is a diagram showing an example of numerical simulation according to the fifth embodiment.

Next, with reference to FIG. 16, description is given of simulation results on attenuation characteristics of the tunable filter 61 according to the fifth embodiment.

As to the filter configuration, a circuit form is adopted, in which bandpass filters, each having input/output impedance of 50Ω, are subordinately connected in two stages in a resistance attenuation circuit of 3 dB/50Ω, using reference lowpass filter of a quintic polar Chebyshev function with a guaranteed attenuation amount of 21 dB disclosed in "Handbook of FILTER SYNTHESIS" by Anatol I. Zverev, 1967, p. 202 to 203.

In FIG. 16, the horizontal axis represents frequency (MHz) and the vertical axis represents attenuation amount (dB). The broken line indicates characteristics of a filter having a center frequency of 2,200 MHz and a bandwidth of 40 MHz. The solid line indicates characteristics of a filter having a center frequency of 2,400 MHz and a bandwidth of 20 MHz. The bandwidth can be doubled by doubling the total gain μta. When the center frequency is 2,300 MHz, it is possible to change the center frequency by 200 MHz, using an LC-VCO including a combination of a coil and a variable capacitor of the conventional technology, since a variable fractional bandwidth is about 10%.

More specifically, it can be seen that functions as the tunable filter are exerted by changing the external control signals BCNTRS and FCNTRS shown in FIG. 15.

Next, temperature fluctuations can be reduced by presetting a correspondence relationship among the resonance frequency of each of resonance circuits in conversion target circuits, temperature and the passband width control signal BCNTRS and controlling the passband width control signal BCNTRS based on information from a temperature sensor.

Moreover, a high-precision filter can be realized by correcting, as needed, the correspondence relationship between the resonance frequency of each of the resonance circuits in the conversion target circuits and the frequency control signal, based on an external reference frequency signal (e.g., a GPS signal). This means that, when the filter according to the fifth embodiment is mounted on an IC circuit, for example, check, correction and the like of initial deviation, temperature fluctuations, changes with time and the like can be performed after completion of manufacture.

As described above, according to the fifth embodiment of the present invention, a tunable filter capable of controlling characteristics can be realized. The tunable filter according to the fifth embodiment is a high-order filter. A low-loss filter having high Q can be realized.

Although the present invention has been described above in detail with reference to the accompanying drawings, the present invention is not limited to such a specific configuration, but includes various changes and equivalent configurations without departing from the scope of the attached claims.

The invention claimed is:

1. An immittance conversion circuit including a first terminal and a second terminal, comprising:
   a conversion target circuit configured to amplify or attenuate a signal supplied to an input terminal with desired frequency and gain characteristics, and output the signal to an output terminal;
   a difference signal detection circuit configured to supply the input terminal of the conversion target circuit with a signal corresponding to a difference between a signal generated at the first terminal and a signal generated at the second terminal;
   an immittance conversion drive circuit configured to perform differential output processing to generate a positive output signal and a negative output signal for a voltage of a difference between a correction voltage and a signal corresponding to the signal outputted from the conversion target circuit, to output one of the positive output signal and the negative output signal to a first feedback signal input terminal in an immittance conversion generation circuit, and to output the other output signal to a second feedback signal input terminal in the immittance conversion generation circuit; and the immittance conversion generation circuit having an immittance conversion generation action to generate immittance to generate, at the first terminal, a signal of a sum of or a difference between currents or voltages of a feedback signal inputted to the first feedback signal input terminal and the signal inputted to the first terminal, and to generate, at the second terminal, a signal of a sum of or a difference between currents or voltages of a feedback signal inputted to the second feedback signal input terminal and the signal inputted to the second terminal, wherein a signal corresponding to a signal of a difference between the signal generated at the first terminal and the signal generated at the second terminal is inputted to the immittance conversion drive circuit as the correction voltage.

2. The immittance conversion circuit according to claim 1, further comprising:

a correction circuit configured to generate the correction voltage, wherein the correction circuit has a feedback loop for adjusting output of the correction voltage in order to reduce the absolute value of a difference between a voltage of a signal corresponding to ½ of a signal of a sum of the signal generated at the first terminal and the signal generated at the second terminal, and a voltage at a TE point in the immittance conversion drive circuit.

3. The immittance conversion circuit according to claim 1, further comprising:

a loss control circuit configured to input, to the immittance conversion drive circuit, a signal of a sum of or a difference between the signal outputted from the conversion target circuit, and the signal corresponding to the difference between the signal generated at the first terminal and the signal generated at the second terminal.

4. The immittance conversion circuit according to claim 1, wherein the conversion target circuit is capable of changing a characteristic according to a signal inputted from outside.

5. The immittance conversion circuit according to claim 1, further comprising:

a switching circuit configured to switch the sign of a difference signal outputted from the difference signal detection circuit, wherein the sign of a total gain of the immittance conversion circuit is changed by controlling the switching circuit according to a signal inputted from outside.

6. The immittance conversion circuit according to claim 1, wherein the immittance conversion generation circuit includes a first immittance level setting impedance and a second immittance level setting impedance, a signal inputted to the first terminal is inputted to the difference signal detection circuit and one of terminals of the first immittance level setting impedance, a signal inputted to the second terminal is inputted to the difference signal detection circuit and one of terminals of the second immittance level setting impedance, the first feedback signal input terminal is connected to the other terminal of the first immittance level setting impedance, and the second feedback signal input terminal is connected to the other terminal of the second immittance level setting impedance.

7. The immittance conversion circuit according to claim 6, wherein the immittance conversion generation circuit controls a value of the first immittance level setting impedance and a value of the second immittance level setting impedance according to a signal inputted from outside.

8. The immittance conversion circuit according to claim 1, wherein the immittance conversion generation circuit includes a first transistor, a second transistor, a third transistor and a fourth transistor, a signal inputted to the first terminal is inputted to an emitter terminal of the first transistor, a signal inputted to the second terminal is inputted to an emitter terminal of the third transistor, a base terminal of the first transistor is connected to a first DC voltage and the difference signal detection circuit through a first load impedance, a base terminal of the third transistor is connected to a third DC voltage and the difference signal detection circuit through a third load impedance, a base terminal of the second transistor is connected to a second DC voltage through a second load impedance, a base terminal of the fourth transistor is connected to a fourth DC voltage through a fourth load impedance, the first feedback signal input terminal is connected to an emitter terminal of the second transistor, the second feedback signal input terminal is connected to an emitter terminal of the fourth transistor, a collector terminal of the first transistor and a collector terminal of the second transistor are connected to one of terminals of a common impedance element, and a collector terminal of the third transistor and a collector terminal of the fourth transistor are connected to the other terminal of the common impedance element.

9. The immittance conversion circuit according to claim 8, wherein the immittance conversion generation circuit controls values of the first to fourth load impedances according to a signal inputted from outside.

10. A filter using a plurality of the immittance conversion circuits according claim 1, wherein each of the immittance conversion circuits changes a center frequency or a cutoff frequency according to a frequency control signal inputted from outside, and changes at least one of bandwidth, a cutoff characteristic, and terminal impedance according to an immittance level control signal inputted from outside.

* * * * *